(12) United States Patent
Pannell

(10) Patent No.: US 8,599,625 B2
(45) Date of Patent: Dec. 3, 2013

(54) SWITCH PIN MULTIPLEXING

(75) Inventor: Donald Pannell, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 1016 days.

(21) Appl. No.: 12/582,171

(22) Filed: Oct. 20, 2009

(65) Prior Publication Data

US 2010/0103185 A1    Apr. 29, 2010

Related U.S. Application Data

(60) Provisional application No. 61/107,827, filed on Oct. 23, 2008.

(51) Int. Cl.
*G11C 7/00* (2006.01)

(52) U.S. Cl.
USPC .................. 365/189.11; 365/222; 365/233.1; 345/55; 345/82

(58) Field of Classification Search
USPC ............. 365/222, 233.1, 189.011; 345/55, 82
See application file for complete search history.

(56) References Cited

U.S. PATENT DOCUMENTS

| | | | | |
|---|---|---|---|---|
| 4,231,105 A | * | 10/1980 | Schuller et al. | 700/90 |
| 4,373,719 A | * | 2/1983 | Nelson et al. | 463/11 |
| 4,387,424 A | * | 6/1983 | Frediani et al. | 709/225 |
| 4,538,146 A | | 8/1985 | Morris | |
| 4,558,315 A | * | 12/1985 | Weiss et al. | 345/55 |
| 7,312,773 B1 | * | 12/2007 | Herzen et al. | 345/82 |
| 2003/0154331 A1 | | 8/2003 | Bader et al. | |
| 2004/0128137 A1 | * | 7/2004 | Bush et al. | 704/275 |
| 2005/0212656 A1 | * | 9/2005 | Denison et al. | 340/5.73 |
| 2006/0117117 A1 | | 6/2006 | Purwin et al. | |
| 2007/0139316 A1 | * | 6/2007 | Hyatt | 345/82 |
| 2007/0288683 A1 | * | 12/2007 | Panabaker et al. | 711/101 |
| 2009/0177410 A1 | * | 7/2009 | Konishi | 702/22 |

OTHER PUBLICATIONS

D'Souza, Stan. "Multiplexing LED Drive and a 4x4 Keypad Sampling." Microchip Technology Inc. (1997): pp. 1-27.
Notification of Transmittal of The International Search Report and The Written Opinion of The International Searching Authority, or The Declaration dated Mar. 31, 2010 in reference to PCT/US2009/061844 (13 pgs).

* cited by examiner

*Primary Examiner* — Son Dinh
*Assistant Examiner* — Uyen B Tran

(57) ABSTRACT

An integrated circuit (IC) within an IC package, where the IC includes a memory control module and a timing module. The memory control module is configured to control read/write operations of a memory IC via N pins of the IC package, where N is an integer greater than 1. The memory IC is external to the IC package. The timing module is configured to control on/off timing of (N*M) light emitting diodes (LEDs) arranged in N columns and M rows connected to the N pins and M pins of the IC, respectively, where M is an integer greater than 1. The read/write operations utilize the N pins during a first period. The N*M LEDs receive data from the M pins and refresh signals from the N pins during a second period that is different than the first period.

20 Claims, 20 Drawing Sheets

| Function | LED[0] | LED[1] | LED[2] | LED[3] |
|---|---|---|---|---|
| Link (any) | 8 | | | 9 |
| Activity (any) | 3 | 8 | | B |
| Link/Act | 9 | (0) | | A |
| 10M Link | | | | |
| 10M Link/Act | A | | 6 | 8 |
| 100M Link | | 9 | 8 | |
| 100M Link/Act | | A | 9 | 7 |
| 1Gig Link | | 3 | A | |
| 1Gig Link/Act | 2 | B | | |
| 10M/100M Link | | | | |
| 10M/100M Link/Act | | 1, 2 | 3 | |
| 100M/1Gig Link | B | | 7 | |
| 100M/1Gig Link/Act | 1 | | B | |
| 10M/1Gig Link | | | | |
| 10M/1Gig Link/Act | 6 | 7 | 1 | 7 |
| Duplex/Collision | 6 | 7 | 0 | 1, 2 |
| Special | 7 | 6 | 2 | 0, 3 |
| *PTP Act* | C | C | C | C |

FIG. 13

| Selection | LED[0] | LED[1] | LED[2] | LED[3] |
|---|---|---|---|---|
| 0 | PTP Act | Link/Act | Duplex/Collision | Special |
| 1 | 100M/ 1Gig Link/Act | 10M/100M Link/Act | 10M/1Gig Link/Act | Duplex/Collision |
| 2 | 1Gig Link/Act | 10M/100M Link Act | Special | Duplex/Collision |
| 3 | Link/Act | 1Gig Link | 100M/1Gig Link | Special |
| 4 | Reserved = off | Reserved = off | Reserved = off | Reserved = off |
| 5 | Reserved = off | Reserved = off | Reserved = off | Reserved = off |
| 6 | Duplex/Collision | Special | 10M Link/Act | 100M Link/Act |
| 7 | Special | Duplex/Collision | 100m/1Gig Link/Act | 10M/1Gig Link/Act |
| 8 | Link | Activity | 100M Link | 10M Link |
| 9 | 10M Link | 100M Link | 1Gig Link | Link |
| A | 10M Link/Act | 100M Link/Act | 1Gig Link/Act | Link/Act |
| B | 100M/1Gig Link | 10M/100M Link | 10M/1Gig Link | Activity |
| C | PTP Act | PTP Act | PTP Act | PTP Act |
| D | Forced Blink | Forced Blink | Forced Blink | Forced Blink |
| E | Forced Off | Forced Off | Forced Off | Forced Off |
| F | Forced On | Forced On | Forced On | Forced On |

FIG. 14

|  | First Display mode | Second Display mode | Third Display mode | Fourth Display mode |
|---|---|---|---|---|
| PHY_LED[0] | Dual Mode 3 | 1Gig Link | 1Gig Link | 1Gig Link |
| PHY_LED[1] | Link/Activity | 100M Link | 100M Link | 100M Link |
| PHY_LED[2] | Link | 10M Link | Link/Activity | 10M Link |
| PHY_LED[3] | Link/Activity | Link/Activity | Duplex | Link/Activity |
| PHY_LED[4] | Activity | Duplex | Activity | Activity |
| PHY_LED[5] | Duplex/Collision | Activity | Duplex/Collision | Duplex/Collision |

FIG. 15

SWITCH PIN MULTIPLEXING

CROSS-REFERENCE TO RELATED APPLICATIONS

This application claims the benefit of U.S. Provisional Application No. 61/107,827, filed on Oct. 23, 2008. The disclosure of the above application is incorporated herein by reference in its entirety.

FIELD

The present disclosure generally relates to integrated circuits (ICs), and more particularly to multiplexing pins of IC packages.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

The cost of integrated circuits (ICs) may be reduced in many ways. For example, the number of functions integrated into an IC may be increased. Alternatively, the number of electrical connecting pins (referred to herein as "pins") of an IC package may be reduced while integrating the same or more functions in an IC contained within the IC package.

A function in an IC is typically performed by one or more logic circuit elements. Examples of logic circuit elements (referred to herein as "logic") include gates, flip-flops, memory cells, etc. Recent advances in IC manufacturing technology permit the size of logic to be reduced. Accordingly, more logic may be integrated into an IC. Adding more logic to an IC, however, may require the addition of more pins to an IC package.

The pins of an IC package are generally connected via bond wires to bond pads of an IC within the IC package. While the size of the internal logic can be reduced, the bond pads typically cannot be made correspondingly smaller. The bond pads need to have a minimum size so as to permit bond wires to be attached to the bond pads. Additionally, the size of transistors needed to drive the external logic requires larger bond pads.

Accordingly, the size and quantity of the bond pads needed for a design of an IC package may cause the design to be pad limited. That is, the size of a die used in the design is dictated by the size and quantity of the bond pads instead of being dictated by the number of logic gates used in the design. Thus, manufacturing costs cannot be reduced by using smaller internal gate geometry since smaller internal gate geometry does not decrease the size of the die. Instead, the bond pads determine the physical limits of the size of the die.

Therefore, use of the bond pads and pins of the IC package may have to be optimized if more logic is to be integrated in the IC package. Alternatively, if more logic is not to be integrated, the number of pins of the IC package may have to be reduced so that the die does not become pad limited as smaller internal gate geometry is used.

SUMMARY

An integrated circuit (IC) within an IC package, where the IC comprises a memory control module and a timing module. The memory control module is configured to control read/write operations of a memory IC via N pins of the IC package, where N is an integer greater than 1. The memory IC is external to the IC package. The timing module is configured to control on/off timing of (N*M) light emitting diodes (LEDs) arranged in N columns and M rows connected to the N pins and M pins of the IC, respectively, where M is an integer greater than 1. The read/write operations utilize the N pins during a first period. The N*M LEDs receive data from the M pins and refresh signals from the N pins during a second period that is different than the first period.

In other features, in response to power being applied to the IC, the memory control module configures the IC by reading information from the memory IC via the N pins during the first period, and the timing module allows testing of the N*M LEDs via the N pins during the second period.

In other features, the timing module generates control signals to output N bits of the data from one of the M pins to display the N bits on N of the N*M LEDs in a corresponding one of the M rows during the second period, respectively.

In other features, the N pins are directly connected to the N columns and the memory IC, respectively.

In other features, current through the N*M LEDs is proportional to a number of the N*M LEDs lit to display the data.

In other features, the memory IC includes electrically erasable programmable read-only memory (EEPROM) that stores information for configuring the IC.

In other features, the memory control module and the timing module exchange a handshake signal that determines the first period and the second period.

In other features, the IC further comprises M physical layer (PHY) devices that output the data to the N*M LEDs via the M pins, respectively. The memory control module configures the M PHY devices by reading information from the memory IC when power is applied to the IC.

In other features, the IC further comprises an LED control module configured to receive status signals from one of the M PHY devices and to generate N bits of status data for the one of the M PHY devices based on the status signals. During the second period, the control signals output the N bits via a corresponding one of the M pins, and N of the N*M LEDs in one of the M rows connected to the corresponding one of the M pins display the N bits, respectively.

In other features, the N bits include a link/activity status and a speed status of the one of the M PHY devices, one of the N of the N*M LEDs displays the link/activity status and the speed status, and a blink rate of the one of the N of the N*M LEDs is proportional to a speed of the one of the M PHY devices.

In other features, the IC further comprises a register module configured to receive the information from a remote network device via a network. The memory control module writes the information to the memory IC via the N pins during the first period when power is applied to the IC.

In other features, the timing module allows testing of the N*M LEDs via the N pins during the second period when power is applied to the IC.

In other features, the memory control module generates a busy signal to indicate when the N pins are used for the read/write operations during the first period, and the timing module generates control signals to latch the data for subsequently outputting the data to the N*M LEDs via the M pins during the second period.

In other features, a network device comprises the IC, the memory IC, and the N*M LEDs.

In still other features, the systems described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings. Like reference symbols in the various drawings indicate like elements.

FIGS. 13-15 are tables showing different functions that may be displayed on the LEDs of FIG. 1.

DESCRIPTION

Figure 1:
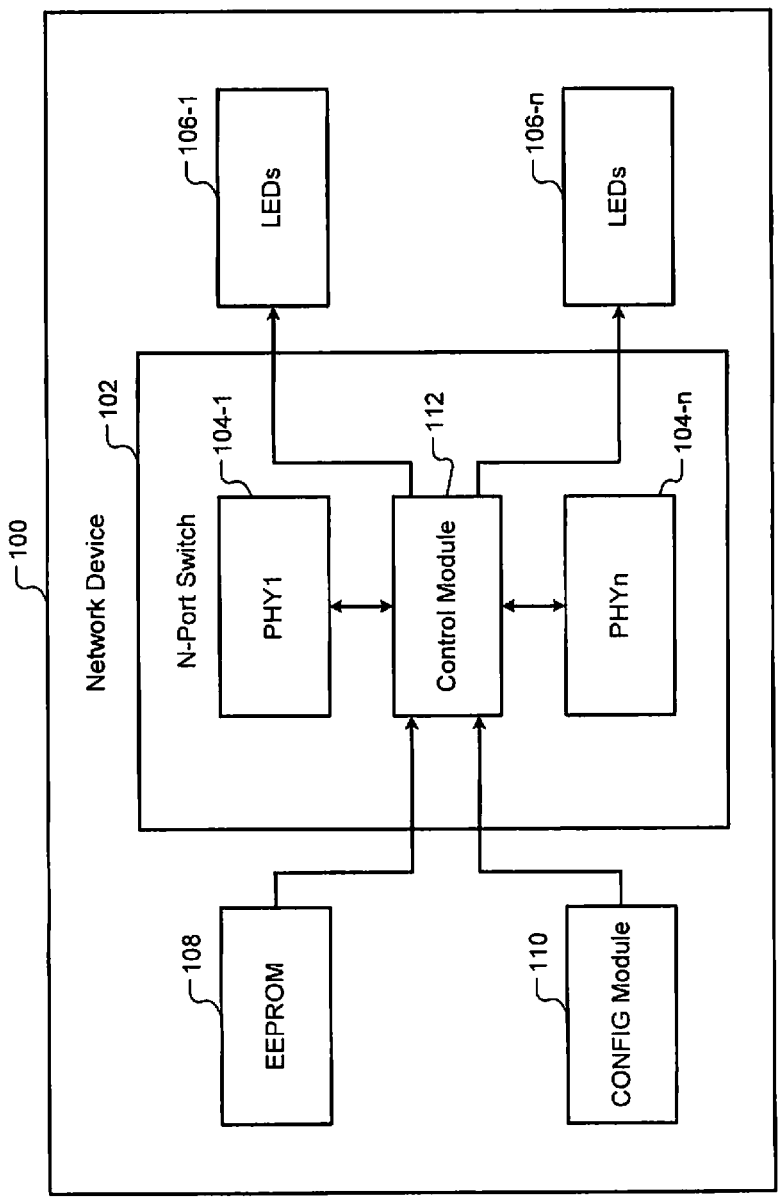
FIG. 1 is a functional block diagram of a network device comprising an N-port switch.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order (or concurrently) without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The present disclosure relates to optimizing use of pins of an IC package. For example only, the present disclosure defines a pin optimization scheme for an IC package comprising a network switch (hereinafter switch). For example only, the switch can be an Ethernet Switch. The switch may be used in a small office/home office (SOHO) environment. The pin optimization scheme may also be used to reduce pin counts of IC packages including other types of devices.

FIG. 1 illustrates a network device 100 comprising an N-port switch 102 (hereinafter switch 102). In one implementation, the switch 102 is integrated in an IC of an IC package. The switch 102 comprises a plurality of physical layer (PHY) devices PHY1 104-1, ..., and PHYn 104-n (collectively PHY devices 104). "n" is an integer greater than 1 and denotes the number of PHY devices 104. In one implementation, the PHY devices 104 are Gigabit Ethernet (GE) PHY devices.

Each of the PHY devices 104 communicate with a network via a port. Each of the PHY devices 104 can indicate a status of the corresponding port via a set of light emitting diodes (LEDs). For example, the PHY device PHY1 104-1 indicates the status of a corresponding port via LEDs 106-1, and each of the PHY devices PHYn 104-n indicates the status of a corresponding port via LEDs 106-n, etc. The LEDs 106-1, ..., and 106-n are collectively referred to as LEDs 106. Each set of LEDs 106 can include a plurality of LEDs. Accordingly, the IC comprising the switch 102 includes a plurality of LED pins per PHY device 104 that connect the IC to the plurality of LEDs.

Additionally, the network device 100 comprises a configuration (CONFIG) module 110 and an electrically erasable programmable read-only memory (EEPROM) 108. In one implementation, the CONFIG module 110 and the EEPROM 108 are used to program the PHY devices 104 and/or the switch 102. In one implementation, the IC package (comprising the switch 102) includes a plurality of CONFIG pins and a plurality of EEPROM pins. The plurality of CONFIG pins are electrically connected to the CONFIG module 110 and the plurality of EEPROM pins are electrically connected to the EEPROM 108.

The CONFIG module 110 may use configurations that are common to the PHY devices 104 to configure the PHY devices 104 via the CONFIG pins. The CONFIG module 110 may use configurations that are common to the network device 100 to configure the network device 100 via the CONFIG pins. The CONFIG module 110 may configure the PHY devices 104 and/or the switch 102 during a reset operation (RESET) when powering up the IC containing the network switch 102. Specifically, the CONFIG module 110 may configure CONFIG pins as input pins during RESET. The CONFIG pins may then be used to configure the PHY devices 104 and/or the switch 102.

When the configurations are complex, however, the number of CONFIG pins available may be insufficient. Accordingly, instructions to operate the PHY devices 104 and/or the switch 102 may be programmed in the EEPROM 108, and the EEPROM 108 may be used instead to program the PHY devices 104 and/or the switch 102.

In one implementation, the pin count of an IC package may be reduced by (time) multiplexing various pins of the IC package—e.g., LED pins, EEPROM pins, and CONFIG pins.

When pins of an IC package are multiplexed, additional logic (e.g., latches, shift registers, etc.) is generally required to implement the multiplexing of such pins. The additional logic is typically external to the IC (and therefore the IC package). The pin multiplexing scheme disclosed herein, however, does not use external logic to implement the multiplexing of pins. Thus, an IC package comprising the switch 102 can be incorporated in the network device 100 easily and cost-effectively.

More specifically, the control module 112 multiplexes pins that drive the LEDs 106 in a row and column arrangement using time multiplexing. In particular, column pins (i.e., pins that drive the columns of the LEDs 106) may be shared with the EEPROM pins. The LEDs 106 may be driven during read/write accesses to the EEPROM 108. The LEDs 106, however, will not light since row pins (i.e., pins that drive the rows of the LEDs 106) will not be in an active state. Using this arrangement, only one pin per PHY device 104 can drive the plurality of LEDs 106 per PHY device 104. Accordingly, the total number of pins (of the IC package) that drive the LEDs 106 is reduced.

For example only, the switch 102 may include five PHY devices. Each PHY device may use four LEDs. A total of 20 LEDs may be supported by multiplexing only five LED pins and the EEPROM pins.

The EEPROM pins are suitable for the time multiplexing disclosed herein due to two reasons. First, the EEPROM pins can sustain the additional load of driving the LEDs. Second, the EEPROM accesses are generally slow (i.e., EEPROM read/write times are long in duration). Accordingly, the LEDs 106 can be driven during the EEPROM accesses and yet can be lit with sufficient brightness due to persistency of vision.

Additionally, to facilitate testing during manufacturing, LEDs are typically turned on during RESET to visually ensure that the LEDs work and are connected properly. The control module 112 can implement the time multiplexing disclosed herein during the reset operation to turn on all the LEDs 106 during RESET. Further, by selectively turning off columns of the LEDs 106, the power consumed by the switch 102 may also be reduced.

Occasionally, a CONFIG pin may be implemented using a single output pin to perform CONFIG operations. For example, a CONFIG pin operation may be performed immediately following a rising edge of RESET. This operation will tri-state output pins (i.e., stop driving the output pins) and let new data settle to a high or a low state depending on whether an internal resistor is used to pull-up or pull-down the pins. Further, this operation will set the pins as inputs, wait for a period, and latch the settled data on the pins. Thus, during a CONFIG operation a bond pad connected to the single output pin may be set as an input during RESET. Data on the output pin may then be latched on a rising edge of RESET to complete the CONFIG operation.

Normally, driving the LEDs on during RESET for testing the LEDs during manufacturing prevents these pins to be used as CONFIG pins during RESET. The teachings of the present disclosure, however, allow the LED pins to be CONFIG pins by performing a separate CONFIG operation immediately following the rising edge of the RESET signal. This is done by turning the LEDs off after the rising edge of RESET and then performing a CONFIG cycle described below. Thereafter, the LEDs and the EEPROM accesses may be time multiplexed. This approach may allow the CONFIG pins also to be implemented on the LED row pins.

Additionally, a CONFIG pin may be saved (i.e., eliminated) and the pin count of an IC package may be further reduced by automatically detecting a type of EEPROM. Typically, a 2-wire EEPROM returns an acknowledge signal. If no acknowledge signal is received after a timeout period, the control module 112 can determine that the EEPROM may be a 4-wire EEPROM or that the EEPROM is not present. When the EEPROM is not present, (in one implementation) all 1's (a halt opcode) are returned. Thus, the control module 112 can detect the type or absence of an EEPROM without reserving a CONFIG pin for detection.

Figure 2:
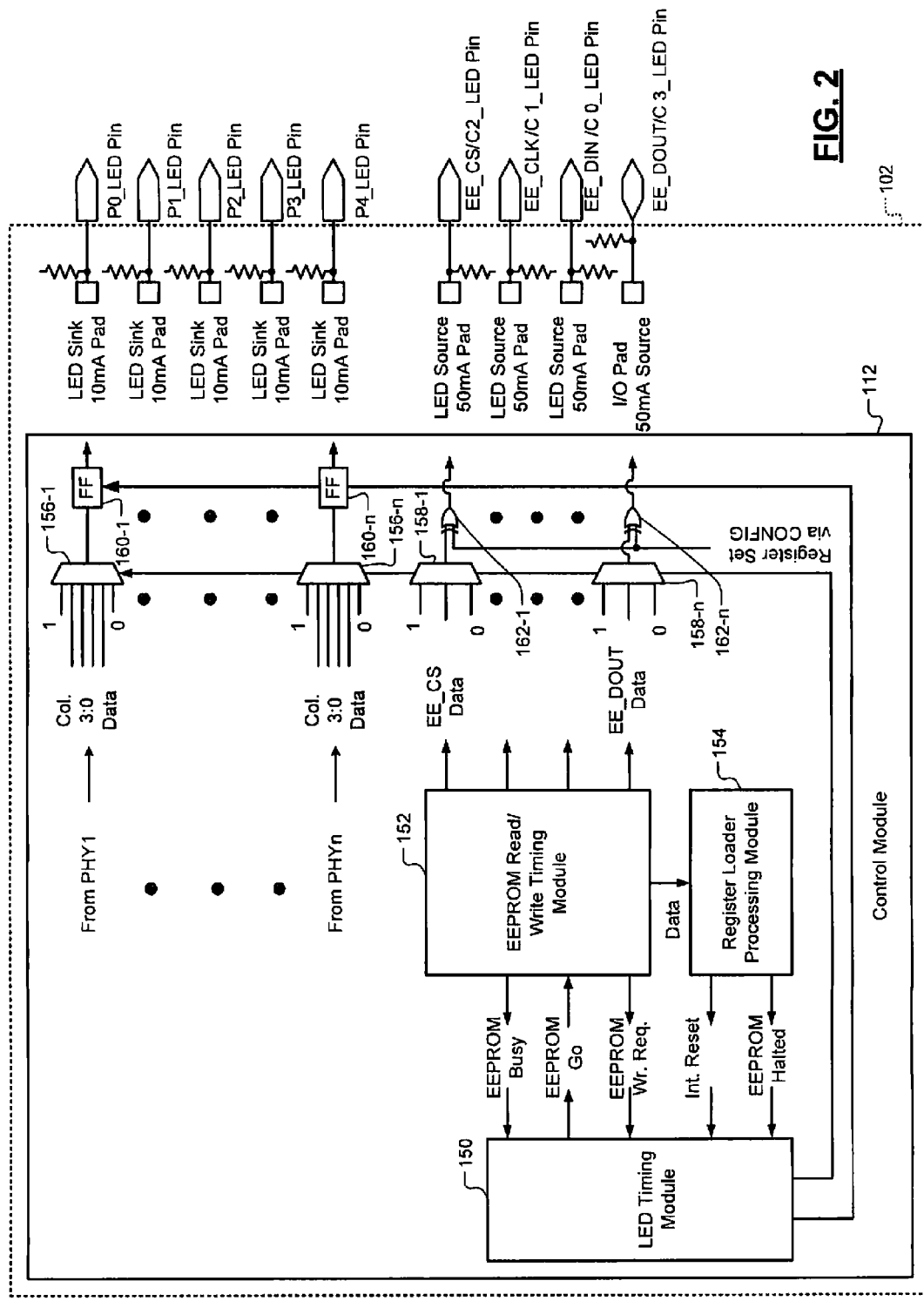
FIG. 2 is a functional block diagram of a control module of the N-port switch of FIG. 1.

Referring now to FIG. 2, the control module 112 comprises a LED timing module 150, an EEPROM read/write timing module 152, and a register loader processing module 154. Additionally, the control module 112 comprises multiplexers 156-1, . . . , and 156-n (collectively multiplexers 156) and multiplexers 158-1, . . . , and 158-n (collectively multiplexers 158). The control module 112 further comprises flip-flops 160-1, . . . , and 160-n (collectively flip-flops 160) and exclusive OR (XOR) gates 162-1, . . . , and 162-n (collectively XOR gates 162).

The LED timing module 150 controls the on/off timing of the LEDs 106 depending on EEPROM read/write operations as described below. The EEPROM read/write timing module 152 (hereinafter EEPROM timing module 152 or memory control module 152) controls the timing of the read/write operations of the EEPROM 108. The register loader processing module 154 loads various registers of the switch 102 based on data received from the EEPROM timing module 152. For example, the register loader processing module 154 can load registers of the PHY devices 104 and/or the switch 102 according to instructions read from the EEPROM 108.

The EEPROM timing module 152 can generate several control signals. For example, (in one implementation) the EEPROM timing module 152 generates EE_CS data, EE_DOUT data, EE_CLK data, and EE_DIN data signals based on the CS, DOUT, CLK, and DIN signals of the EEPROM 108. The EE_CS data, EE_DOUT data, EE_CLK data, and EE_DIN data signals are output to the multiplexers 158-1, . . . , and 158-n, respectively.

Additionally, the EEPROM timing module 152 can generate an EEPROM busy signal indicating that the EEPROM 108 is busy reading or writing. The EEPROM timing module 152 can generate an EEPROM write request signal indicating that an EEPROM write operation is requested. The EEPROM busy and EEPROM write request signals are output to the LED timing module 150. In one implementation, the LED timing module 150 does not refresh the LEDs 106 when the EEPROM busy signal is received. This allows the EEPROM 108 to exclusively use the EEPROM pins that are otherwise shared with the LEDs 106.

The EEPROM timing module 152 detects the EEPROM 108 and outputs data read from the EEPROM 108 to the register loader processing module 154. Alternatively, the EEPROM timing module 152 outputs data indicating absence of the EEPROM 108. The register loader processing module 154 loads registers of the switch 102 and/or the PHY devices 104 based on the data received from the EEPROM timing module 152. The register loader processing module 154 also loads the registers of the switch 102 and/or the PHY devices 104 based on inputs received from the CONFIG module 110.

The register loader processing module 154 generates an internal reset (e.g., an internal power on reset (POR)) signal. Additionally, the register loader processing module 154 generates an EEPROM halted signal based on data received from the EEPROM timing module 152.

The LED timing module 150 controls the on/off timing of the LEDs 106 based on the EEPROM busy, EEPROM write request, internal reset, and EEPROM halted signals. The LED timing module 150 outputs an EEPROM Go signal to the EEPROM timing module 152. The EEPROM Go signal indicates when the LED timing module 150 has completed a refresh cycle of the LEDs 106. Alternatively, the EEPROM Go signal can indicate when the refresh cycle is suspended based on inputs received by the LED timing module 150 (e.g., when EEPROM write request is received). The EEPROM timing module 152 controls the read/write operations of the EEPROM 108 based on the EEPROM Go signal.

The multiplexers 156-1, . . . , and 156-n receive data (e.g., column 3:0 data) from the PHY devices PHY1 104-1, . . . , and PHY4 104-4, respectively. The LED timing module 150 generates control signals that control the multiplexers 156, 158 and the flip-flops 160. The flip-flops 160-1, . . . , and 160-n latch data output by the multiplexers 156-1, . . . , and 156-n, respectively.

The outputs of the flip-flops 160 serve as row-select signals for the LEDs 106 and drive the LEDs 106 via respective bond pads and pins of the switch 102. For example, the outputs of the flip-flops 160-1, . . . , and 160-4 drive the LEDs 106 connected to pins P0_LED Pin, . . . , and P4_LED Pin of the switch 102, respectively. P0, . . . , and P4 denote rows of the LEDs 106 corresponding to the PHY devices PHY1 104-1, . . . , and 104-4, respectively.

The outputs at pins P0_LED Pin, . . . , and P4_LED Pin serve as row-selects and select rows of the LEDs 106. For example, the output of the multiplexer 156-1 at pin P0_LED Pin selects a row P0 of the LEDs 106 that correspond to the PHY device PHY1 104-1, and so on. Bond pads of the switch 102 that connect to the pins P0_LED Pin, . . . , and P4_LED Pin sink current when the respective LEDs 106 are lit. P0_LED Pin, . . . , and P4_LED Pin are shown to be receiving data from the PHY devices 104 for example only. P0_LED Pin, . . . , and P4_LED Pin may receive input data from sources other than the PHY device 104.

The outputs of the multiplexers 158 are output via the XOR gates 162. The outputs of the multiplexers 158 sever as columns select signals for the LEDs 106 and drive the LEDs 106 via respective bond pads and pins of the switch 102. For example, the outputs of the multiplexers 158-1, . . . , and 158-n drive the LEDs 106 connected to pins EE_CS/C2_LED Pin, EE_CLK/C1_LED Pin, EE_DIN/C0_LED Pin, and EE_DOUT/C3_LED Pin, respectively. C1, . . . , and C4 denote columns of the LEDs 106.

The outputs at pins EE_CS/C2_LED Pin, EE_CLK/C1_LED Pin, EE_DIN/C0_LED Pin, and EE_DOUT/C3_LED Pin serve as column-selects and select columns of the LEDs 106. For example, the output of the multiplexer 158-1 at pin EE_CS/C2_LED Pin selects a column C2 of the LEDs 106, and so on. Bond pads of the switch 102 that connect to the pins EE_CS/C2_LED Pin, EE_CLK/C1_LED Pin, EE_DIN/CO LED Pin, and EE_DOUT/C3_LED Pin source current when the LEDs 106 are lit.

Thus, columns of the LEDs 106 are multiplexed with the EEPROM pins and signals of the EEPROM 108. Although not shown for simplicity, the pins corresponding to the rows of the LEDs may also be multiplexed with the EEPROM pins and the signals of the EEPROM 108.

Figure 3:
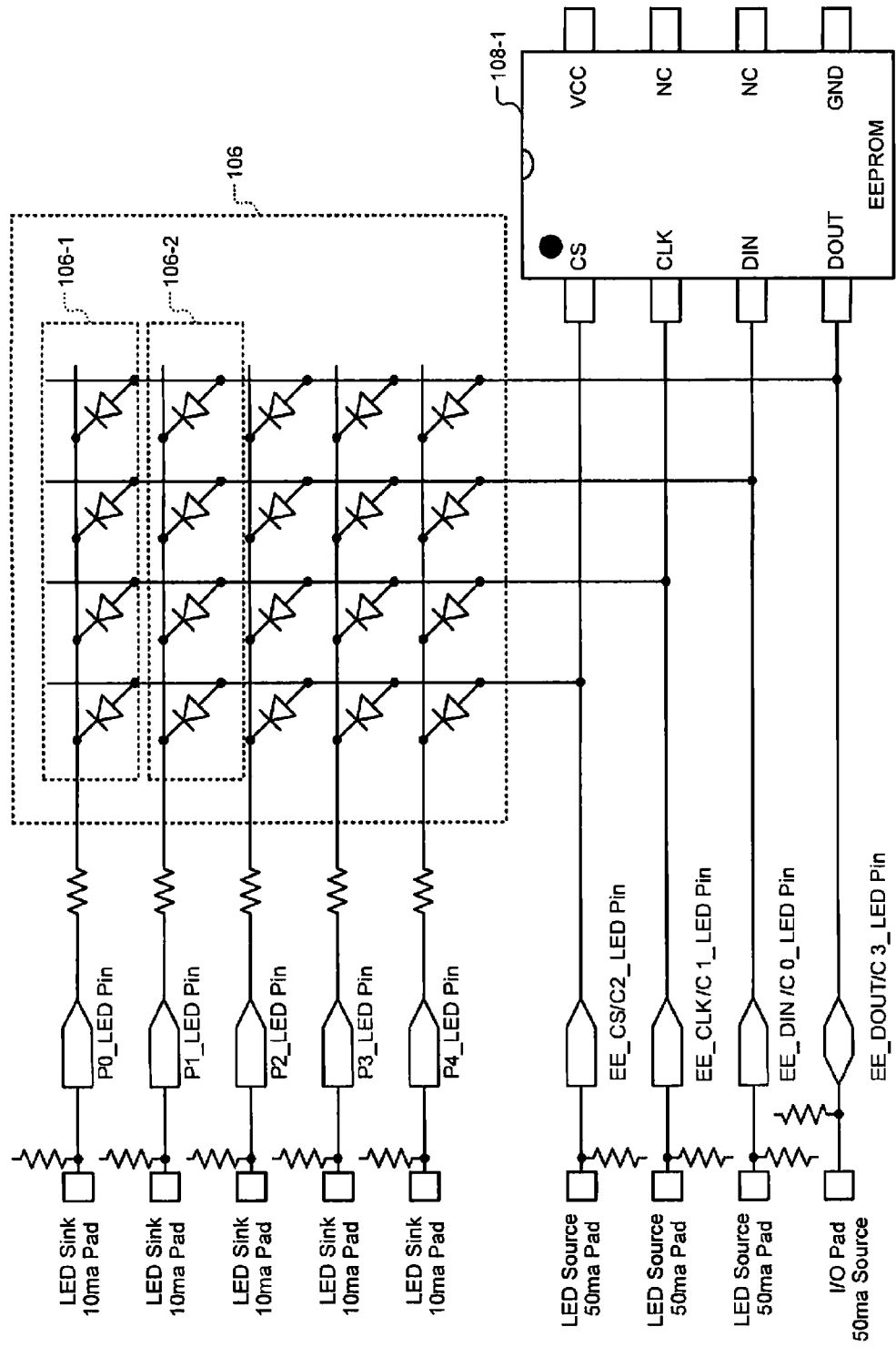
FIGS. 3 and 4 depict pin connections of an integrated (IC) comprising the N-port switch of FIG. 1 to an electrically erasable programmable read-only memory (EEPROM) and light emitting diodes (LEDs).
Figure 4:
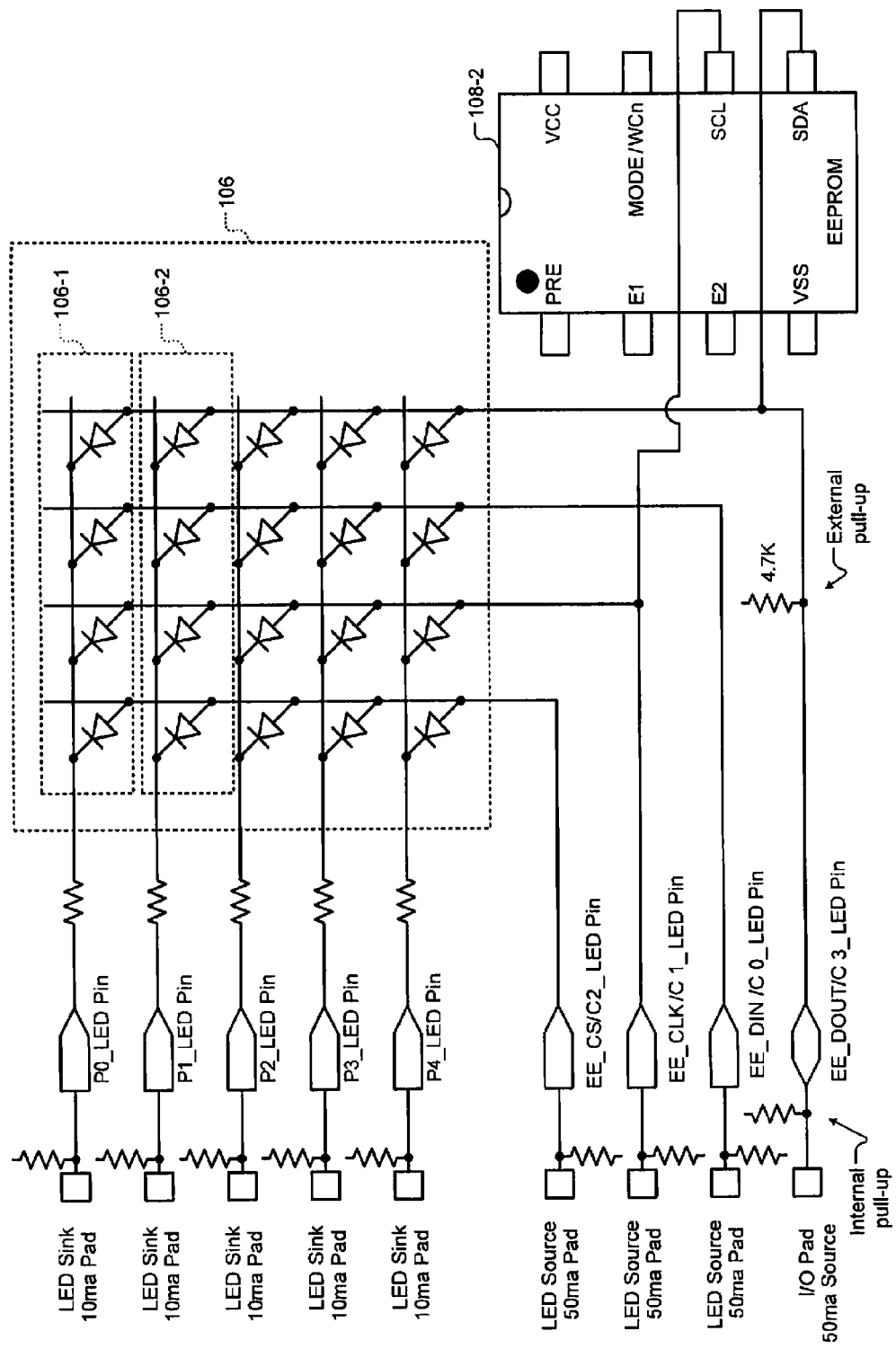

Referring now to FIGS. 3 and 4, multiplexing of LEDs using pins of two different EEPROMs is shown. In FIG. 3, a first EEPROM 108-1 uses chip select (CS), clock (CLK), data input (DIN), and data output (DOUT) signals. The first EEPROM 108-1 ignores activity on CLK and DIN pins when CS is low. When CS is low, DOUT of the first EEPROM 108-1 is tri-stated. Accordingly, the LED Columns 0, 1, and 3 may be operated while the first EEPROM 108-1 ignores activity on CLK and DIN pins (i.e., while CS is low, and DOUT is tri-stated). Alternatively, LED Column 2 may be operated as the first EEPROM 108-1 stays idle when CS is high, and when there is no rising edge on CLK.

In FIG. 4, a second EEPROM 108-2 uses Write Protect Enable (PRE), Chip Enable (E1 and E2), Serial Data Address (SDA), Serial Clock (SCL), Multibyte/Page Write Mode (Mode) and Write Control (WCn) signals. The second EEPROM 108-2 ignores activity on SCL and SDA pins until SDA transitions from high to low while SCL is high. Accordingly, the LEDs may be operated while the second EEPROM 108-2 ignores activity on SCL and SDA pins (i.e., until SDA transitions from high to low while SCL is high).

For example only, the signals of the first EEPROM 108-1 are used to describe the multiplexing scheme below. The multiplexing described herein, however, can be implemented using the signals of the second EEPROM 108-2 or other suitable EEPROM.

Referring now to FIGS. 5-10, the control module 112 performs the time multiplexing of the LEDs 106 and the EEPROM pins as follows. While the time durations used herein are approximate, the relative magnitudes of the time durations are of essence.

Figure 5:
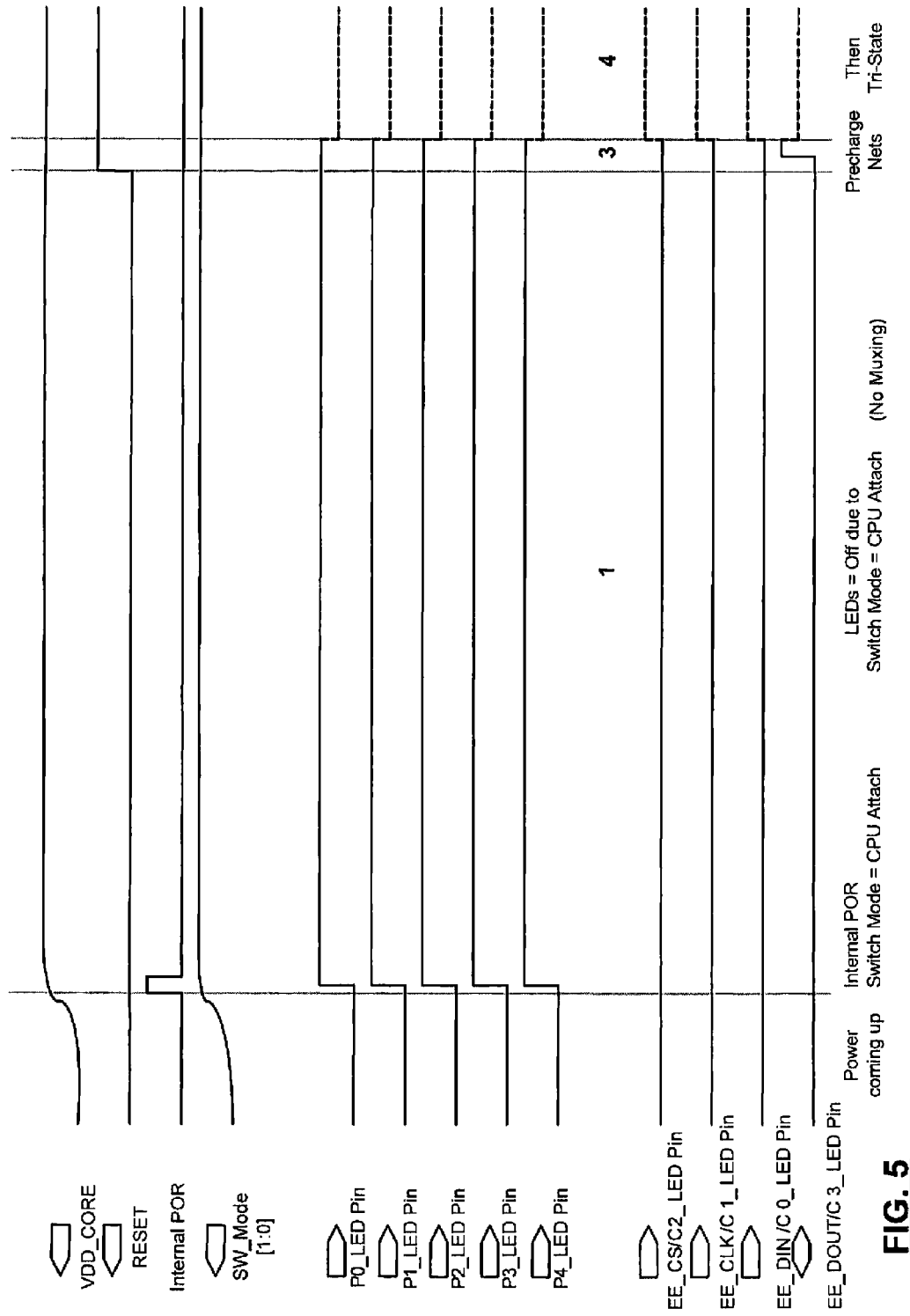
FIGS. 5-10 are timing diagrams of signals used to read an EEPROM and to refresh LEDs via multiplexed pins of the IC comprising the N-port switch of FIG. 1.

Referring now to reference numeral (1) in FIG. 5, while RESET is active low and if SW_MODE=CPU Attach/Unmanaged then the control module 112 does not light the LEDs 106. That is, drive Px_LEDs high and Cx_LEDs low.

Figure 6:
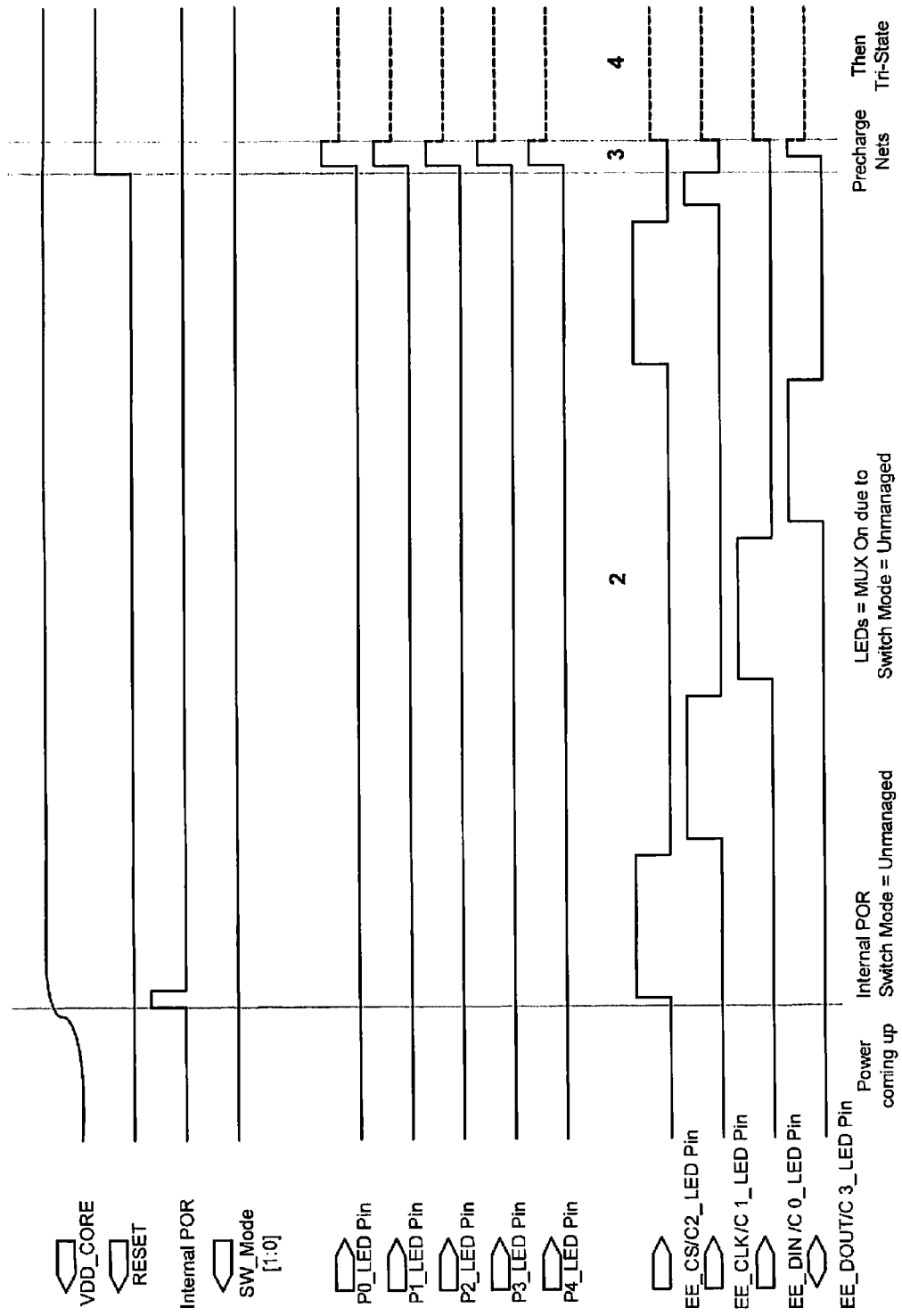

Referring now to reference numeral (2) in FIG. 6, while RESET is active low and if SW_MODE≠CPU Attach/Disable then the control module 112 lights the LEDs 106. That is, the control module 112 drives Px_LEDs low and multiplexes the Cx_LEDs as follows. (a) Drive C0_LED high for 500 uSec. (b) Drive Cx_LEDs low for 10 uSec. (c) Drive C1_LED high for 500 uSec. (d) Drive Cx_LEDs low for 10 uSec. (e) Drive C2_LED high for 500 uSec. (f) Drive Cx_LEDs low for 10 uSec. (g) Drive C3_LED high for 500 uSec. (h) Drive Cx_LEDs low for 10 uSec. (i) Repeat (a)-(h) until RESET goes high. This cycling of Cx_LED line stops as soon as RESET goes high even in the middle of driving a Cx_LED high.

The 10 uSec low time for the Cx_LED lines between each Cx_LED Column enable insures that the EEPROM signals do not overlap. Accordingly, 10 uSec low time for the Cx_LED lines between each Cx_LED Column enable insures that an EEPROM access does not start.

Figure 7:
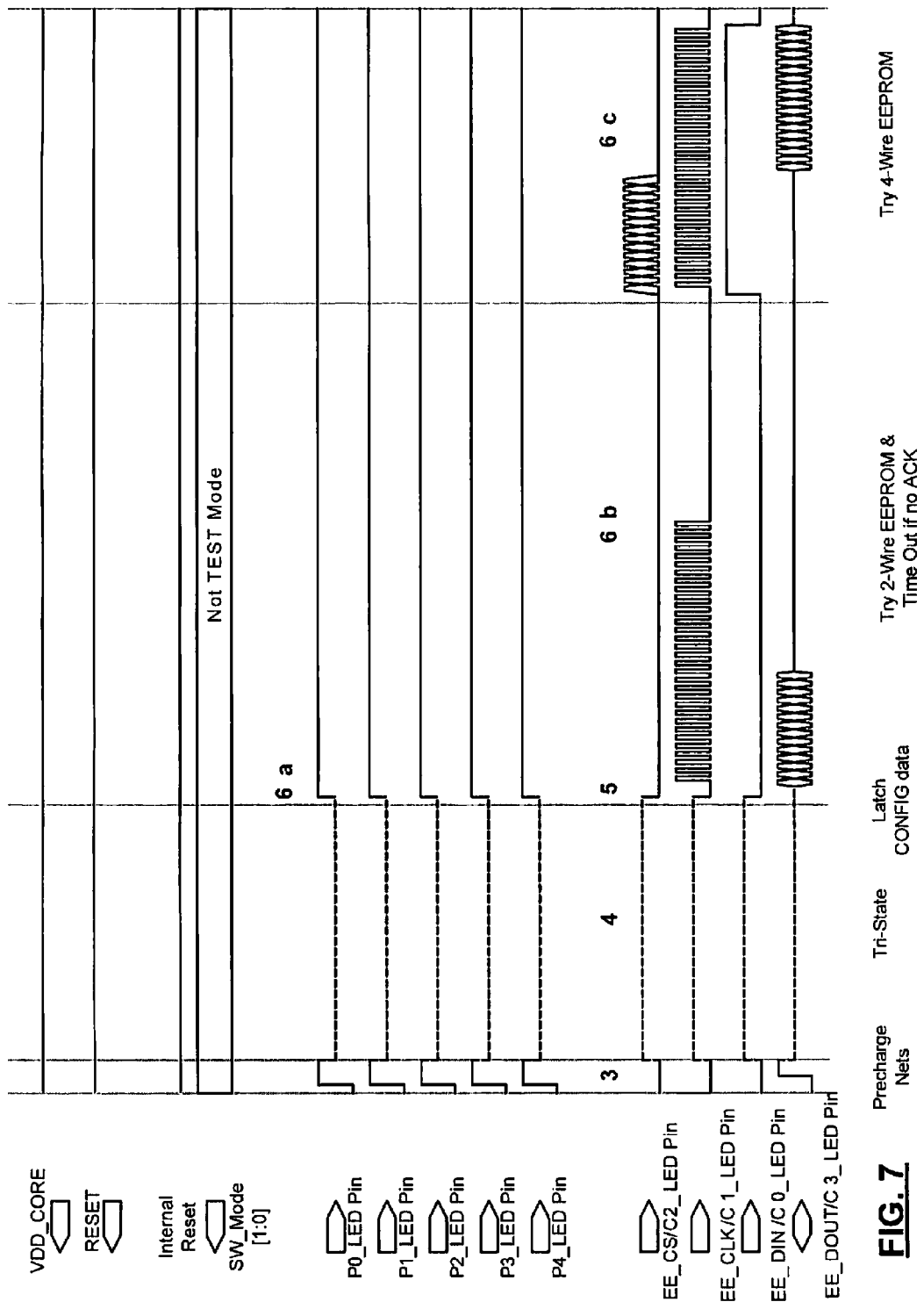

Referring now to reference numeral (3) in FIGS. 5-7, the control module 112 pre-charges nets before a CONFIG read of the pins. That is, the control module 112 drives for 10 uSec Px_LEDs high and Cx_LEDs low except the C3_LED, which is driven high. The Px_LEDs are driven high 1 uSec before the C3_LED is driven high. Otherwise, the C3 LEDs could light up.

Referring now to reference numeral (4) in FIGS. 5-7, the control module 112 tri-States Cx_LED and Px_LED pins. That is, the control module 112 makes Cx_LED and Px_LED pins inputs.

Referring now to reference numeral (5) in FIG. 7, if SW_MODE≠Test mode, the control module 112 waits 1 mSec and then latches the input data as CONFIG data. Otherwise, the control module 112 latches the input data without the wait. The Test mode comes up faster this way since the CONFIG delays are skipped in simulation. To use the test mode during manufacturing, the CONFIG delays may not be skipped.

Referring now to reference numerals (6a)-(6d) in FIGS. 7-8, if SW_MODE ≠Test mode, the control module 112 reads the EEPROM as follows. 6(a) Drive Px_LEDs high, and ensure that the LEDs are off for 20 uSec. 6(b) Select 2-Wire EEPROM type and attempt to read a $1^{st}$ location. If the EEPROM 108 acknowledges, continue reading the EEPROM code until a Delay or Halt Opcode is received. If the Delay or Halt Opcode is received, go to reference numeral (7) in FIG. 8. If the EEPROM 108 does not acknowledge within 1 mSec of the end of the attempted read operation, go to reference numeral 6(c) in FIG. 7.

6(c) Select 4-Wire EEPROM type and attempt to read the $1^{st}$ location. Continue reading the EEPROM code until a Delay or Halt Opcode is received. If the Delay or Halt Opcode is received, go to reference numeral (7) in FIG. 8. 6(d) EEPROM reads occur only until a Delay or Halt Opcode is received. This allows the EEPROM 108 to execute reads since the LEDs 106 are off during this initial EEPROM reading.

Figure 8:
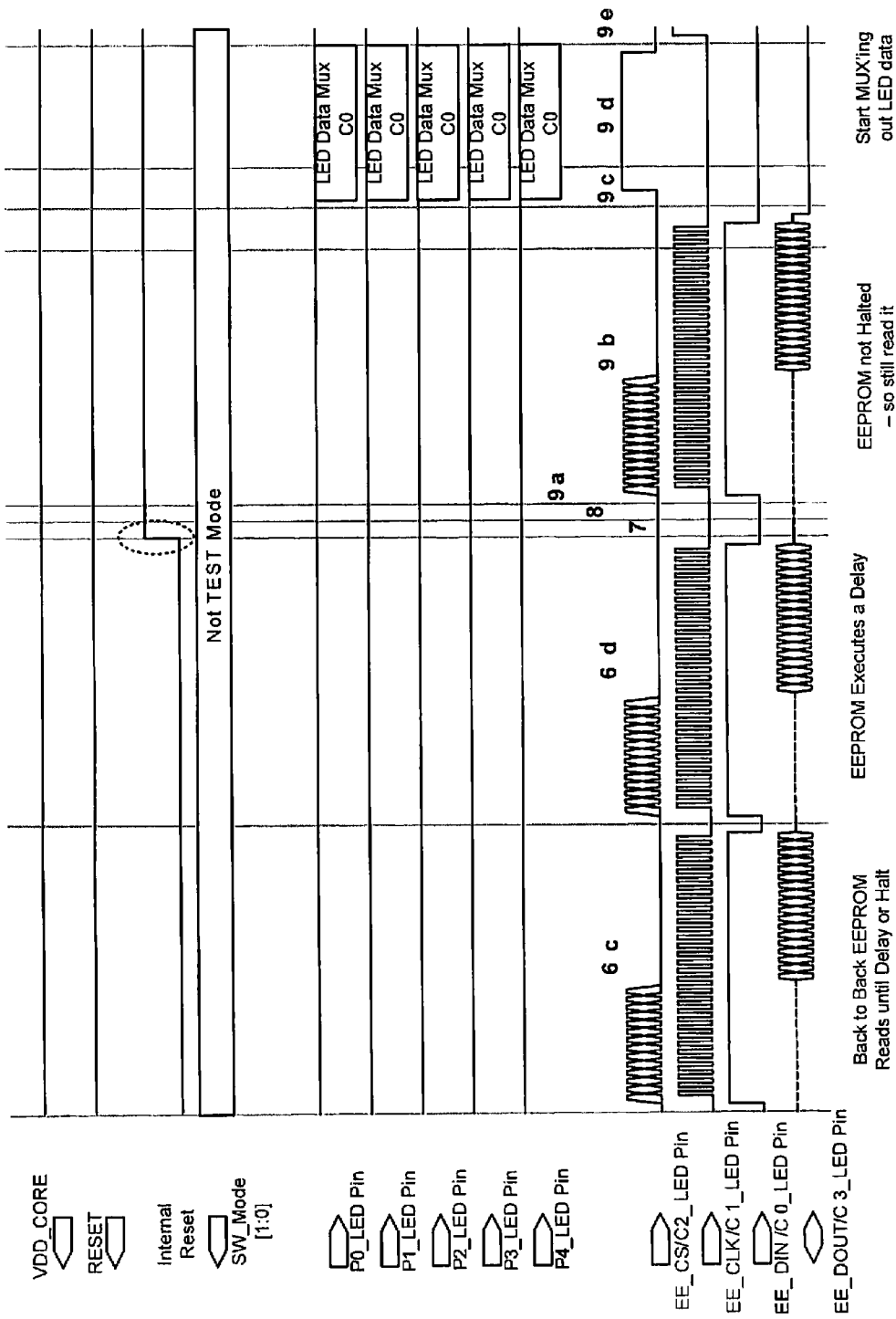

Referring now to reference numeral 7 in FIG. 8, if SW_MODE=Test mode, or if the EEPROM 108 executes a Halt or Delay Opcode, the control module 112 releases the internal RESET. When the internal RESET is released, the switch core can initialize. Referring now to reference numeral 8 in FIG. 8, the control module 112 drives Cx_LEDs low for 10 uSec.

Figure 9:
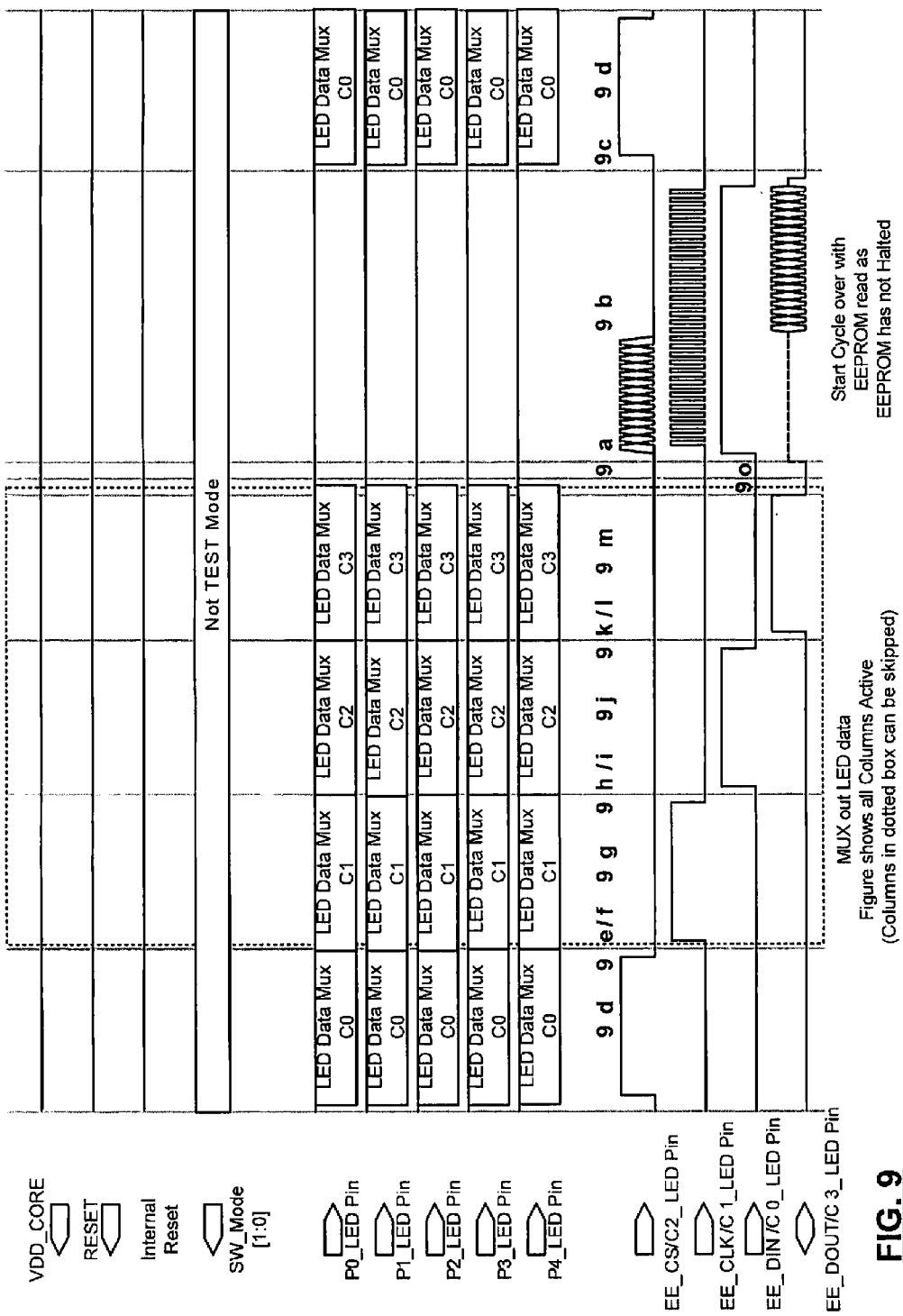
Figure 10:
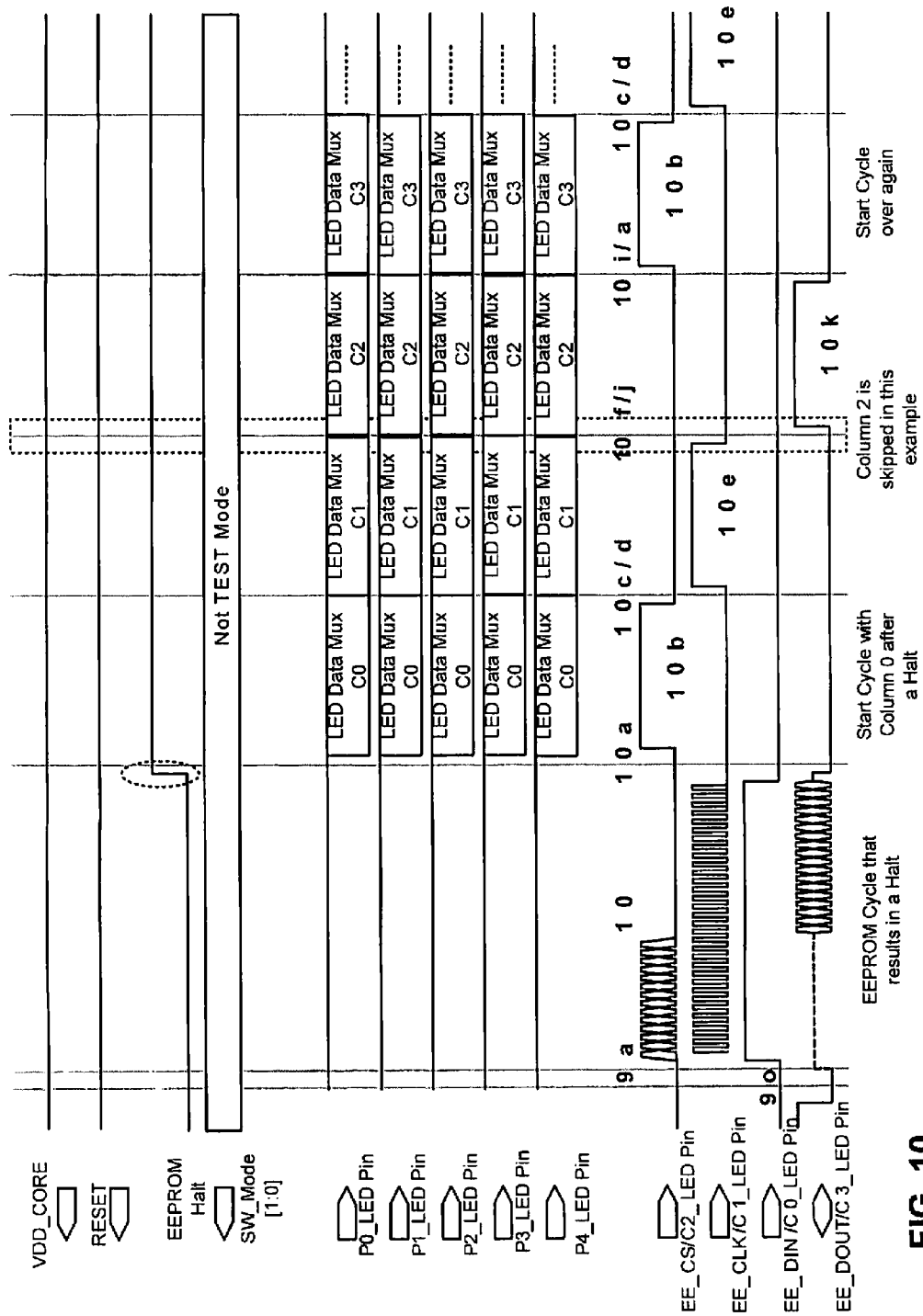

Referring now to reference numerals 9(a)-9(m) and 9(o) in FIGS. 8-10, if the EEPROM 108 executed a Delay (and not a Halt Opcode) then the control module 112 multiplexes the LEDs 106 with the EEPROM reads as follows. 9(a) Drive Px_LEDs high for 10 uSec. Drive Px_LEDs high for 10 uSec in the middle of 9(n) below if looping. 9(b) Perform 1 EEPROM read operation. This should take less than 500 uSec. If this is a 2-Wire EEPROM cycle, only 8-bits are read at a time in one of these read operations. 9(c) Drive Px_LEDs with Column 0's data. The control module 112 latches Px_LED data using flip-flops 160 in the steps described below so that the data does not change while a Cx_LED line is high.

9(d) Drive C0_LED high for 500 uSec. 9(e) Drive Cx_LEDs low for 10 uSec. The 10 uSec low time for the Cx_LED lines between each Cx_LED Column enable insures that the EEPROM signals do not overlap. Accordingly, 10 uSec low time for the Cx_LED lines between each Cx_LED Column enable insures that an EEPROM access does not start.

9(f) Drive Px_LEDs with Column 1's data. Drive Px_LEDs with Column 1's data in the middle of the 9(e). 9(g) Drive C1_LED high for 500 uSec. 9(h) Drive Cx_LEDs low for 10 uSec. 9(i) Drive Px_LEDs with Column 2's data. Drive Px_LEDs with Column 2's data in the middle of 9(h). Column 1, Column 2, and/or Column 3 may be skipped depending on current register settings. Skipping the columns, if the columns are currently unused, allows other LED Columns to be brighter since the other LED Columns are on longer. Alternatively, Column 0 may be skipped as well.

9(j) Drive C2_LED high for 500 uSec. 9(k) Then drive Cx_LEDs low for 10 uSec. 9(l) Drive Px_LEDs with Column 3's data. Drive Px_LEDs with Column 3's data in the middle of 9(k). 9(m) Drive C3_LED high for 500 uSec. 9(n) Drive Cx_LEDs low for 10 uSec. 9(o) Repeat 9(a)-9(m) until the EEPROM executes a Halt Opcode. Then go to reference numeral (10) in FIG. 10.

Referring now to reference numerals 10(a)-10(k) in FIG. 10, if the EEPROM 108 executed a Halt (and not a Delay Opcode) then the control module 112 multiplexes the LEDs 106 without the EEPROM reads as follows. Preventing EEPROM reads when the EEPROM 108 is no longer needed allows the LEDs 106 to be brighter as the LED columns are on longer. 10(a) Drive Px_LEDs with Column 0's data. The control module 112 drives Px_LEDs with Column 0's data in the middle of 10(1) below if looping. The control module 112 latches Px_LED data using the flip-flop 160 in the steps described below so that the data does not change while a Cx_LED line is high.

10(b) Drive C0_LED high for 500 uSec. 10(c) Drive Cx_LEDs low for 10 uSec. The 10 uSec low time for the Cx_LED lines between each Cx_LED Column enable insures that the EEPROM signals do not overlap. Accordingly, 10 uSec low time for the Cx_LED lines between each Cx_LED Column enable insures that an EEPROM access does not start.

10(d) Drive Px_LEDs with Column 1's data. Drive Px_LEDs with Column 1's data in the middle of 10(c) above.

10(e) Drive C1_LED high for 500 uSec. 10(f) Drive Cx_LEDs low for 10 uSec. 10(g) Drive Px_LEDs with Column 2's data. Drive Px_LEDs with Column 2's data in the middle of 10(f) above. Column 2 and/or Column 3 may be skipped depending on current register settings. Skipping the columns, if the columns are currently unused, allows other LED Columns to be brighter since the other LED Columns are on longer. Alternatively, Column 0 or Column 1 may be skipped as well.

10(h) Drive C2_LED high for 500 uSec. 10(i) Then drive Cx_LEDs low for 10 uSec. 10(j) Drive Px_LEDs with Column 3's data. Drive Px_LEDs with Column 3's data in the middle of 10(i) above. 10(k) Drive C3_LED high for 500 uSec. 10(l) Drive Cx_LEDs low for 10 uSec. 10(m) Repeat 10(a)-10(l).

In FIGS. 5-10, areas enclosed in boxes with dotted lines indicate LED columns that may not be displayed in this example. LEDs are displayed only after an EEPROM Halt (indicated by an oval). This pattern repeats until the columns to be display are changed or an EEPROM write is performed. When the EEPROM write is performed, the EEPROM write is inserted at the start of a multiplexing cycle and is allowed to complete. That is, the LED refreshes are suspended until the write cycle completes.

To facilitate the time multiplexing described herein, the EEPROM timing module 152 includes wait states between EEPROM read/write cycles. Specifically, the EEPROM timing module 152 waits between the read/write cycles for the EEPROM Go signal. The EEPROM Go signal can be de-asserted as soon as the EEPROM Busy signal becomes active so that the EEPROM timing module 152 does not attempt to access the EEPROM 108 again.

These wait states may occur between divisible EEPROM operations. If the EEPROM 108 is 4-Wire type, a divisible operation is a single 16-bit read (or a single 16-bit write plus a write busy time). If the EEPROM 108 is 2-Wiretype, a divisible operation is a single 8-bit read (or an 8-bit write plus the write busy time). 2-Wire EEPROMs may split the operation at 8-bits so that no EEPROM read operation is longer than 500 uSec. The write operations may be longer than 500 uSec. Once a single EEPROM transfer is started, the EEPROM timing module 152 asserts the EEPROM Busy signal until the transfer is completed.

The EEPROM Busy/Go handshake described above allows for various EEPROM performance options (modes) without modifying the EEPROM timing module 152. These modes include a full EEPROM access mode (with no LED access), a mixed EEPROM access mode (with LED access), an LED-only mode, and an EEPROM write mode. Each mode is described below in turn.

The full EEPROM access mode is used for initial EEPROM reading until an EEPROM Halt or an EEPROM Delay Opcode is executed (indicated by EEPROM Halted or Internal Reset, respectively). This mode can hold the EEPROM Go signal active until the EEPROM Halted or Internal Reset signals change state. During this mode, the EEPROM timing module 152 exclusively uses the EEPROM pins until the mode changes.

The mixed EEPROM access mode is used from the time when a first EEPROM Delay Opcode occurs until the time when an EEPROM Halt Opcode occurs. This mode de-asserts the EEPROM Go signal as soon as the EEPROM Busy signal is asserted and allows the EEPROM 108 to exclusively use the EEPROM pins as long as the EEPROM Busy signal is active. Once the EEPROM Busy signal is de-asserted, the LED timing module 150 multiplexes the LEDs 106 from Column 0 to Column 1, and so on. The time multiplexing may refresh only active Columns.

Upon completing the refresh cycle, the LED timing module 150 returns control of the shared EEPROM pins to the EEPROM 108. Additionally, the LED timing module 150 generates the next EEPROM Go signal. This cycle repeats until an EEPROM Halted is detected.

The LED-only mode is used whenever the EEPROM Halted signal is active. In this mode, the LED timing module 150 multiplexes the LEDs 106 from Column 0 to Column 1, and so on. The time multiplexing may refresh only active Columns. This cycle repeats until the EEPROM is Re-Loaded or is written to via registers. The full EEPROM access mode is restarted when the EEPROM is Re-Loaded or is written to.

The EEPROM write mode is used to write to the EEPROM 108. This mode could start in the middle of any of the above modes. When an EEPROM write is requested via the registers, the Register Loader processing module 154 may Halt and generate an EEPROM Write Request. The LED timing module 150 returns control of the shared EEPROM pins to the EEPROM timing module 152. The control should be returned just before LED Column 0 would be displayed.

When the pins stabilize, the EEPROM Go signal is generated and the EEPROM pins stay in this mode until the EEPROM Busy signal is de-asserted. After each EEPROM write, the EEPROM pins go back into the LED-only mode. When all the EEPROM writes are completed, the register loader processing module 154 may be reloaded, thereby restarting the full EEPROM access mode.

In the time multiplexing described herein, the flip-flops 160 ensure that the data output to the LEDs 106 is latched and that the data does not change during a 500 uSec refresh cycle. For example, the data does not change when a Cx_LED pin is driving an LED column in steps 9d, 9g, 9j or 9m, or in steps 10b, 10e, 10h or 10k. This ensures proper functioning of the bond pads that connect to the Cx_LED pins (hereinafter Cx_LED bond pads).

The Cx-LED bond pads may have the following characteristics. In the test mode, the Cx-LED bond pads may have a fast slew rate so that high-frequency test patterns (e.g., test patterns of 25 MHz) can be executed. In the EEPROM access mode, the Cx-LED bond pads may have a slow slew rate. The slow slew rate may limit electromagnetic interference (EMI) generated by the LEDs 106. Accordingly, the EMI is within standards set forth by the federal communications commission (FCC). The slow slew rate may be slower than normal fast-edge speeds but not as slow as typical slow LED bond pads.

In the LED-only mode, the Cx-LED bond pads may have a very slow slew rate to prevent EMI issues. Further, in the LED-only mode, the Cx-LED bond pads may source a current of 10 mA, 20 mA, 30 mA, 40 mA, or 50 mA based on the number of Px_LED lines that are low during an LED column refresh cycle. This ensures that the LEDs 106 stay at the same brightness regardless of whether one, two, . . . , or five LEDs are turned on. That is, the Cx-LED bond pads supply an amount of current based on the number of LEDs that will be lit at a given time.

The current values mentioned above are for example only. Other values may be used so long as the values increment in multiples of a first value. For example, if the first value is 15 mA, then subsequent values can be 30 mA, 45 mA, and so on. Accordingly, the Cx_LED bond pads may have programmable drive strengths and programmable slew rates.

Additionally, the Px-LED bond pads may have the following characteristics. In the test mode, the Px-LED bond pads may have a fast slew rate so that high-frequency test patterns (e.g., test patterns of 25 MHz) can be executed. In the LED-only mode, the Px-LED bond pads may have a very slow slew rate to prevent EMI issues. Further, in the LED-only mode, the Px-LED bond pads may sink a current of 10 mA or some other value as needed.

In some implementations, when the switch 102 includes a CPU, a plurality of LED display modes may be configured using the CPU. The CPU may reprogram LED display modes based on user inputs. When the switch 102 does not include the CPU, an EEPROM that is external to the switch 102 (e.g., the EEPROM 108) may be used to configure the LEDs 106. Using the external EEPROM, however, may not be cost-effective.

Instead, when the switch 102 does not include a CPU, the LED display modes may be configured using CONFIG pins and/or registers. Accordingly, an LED configuration module that configures the LEDs 106 may be included in the switch 102. The LED configuration module may configure the LEDs 106 as follows regardless of whether the LEDs 106 are time multiplexed.

Figure 11:
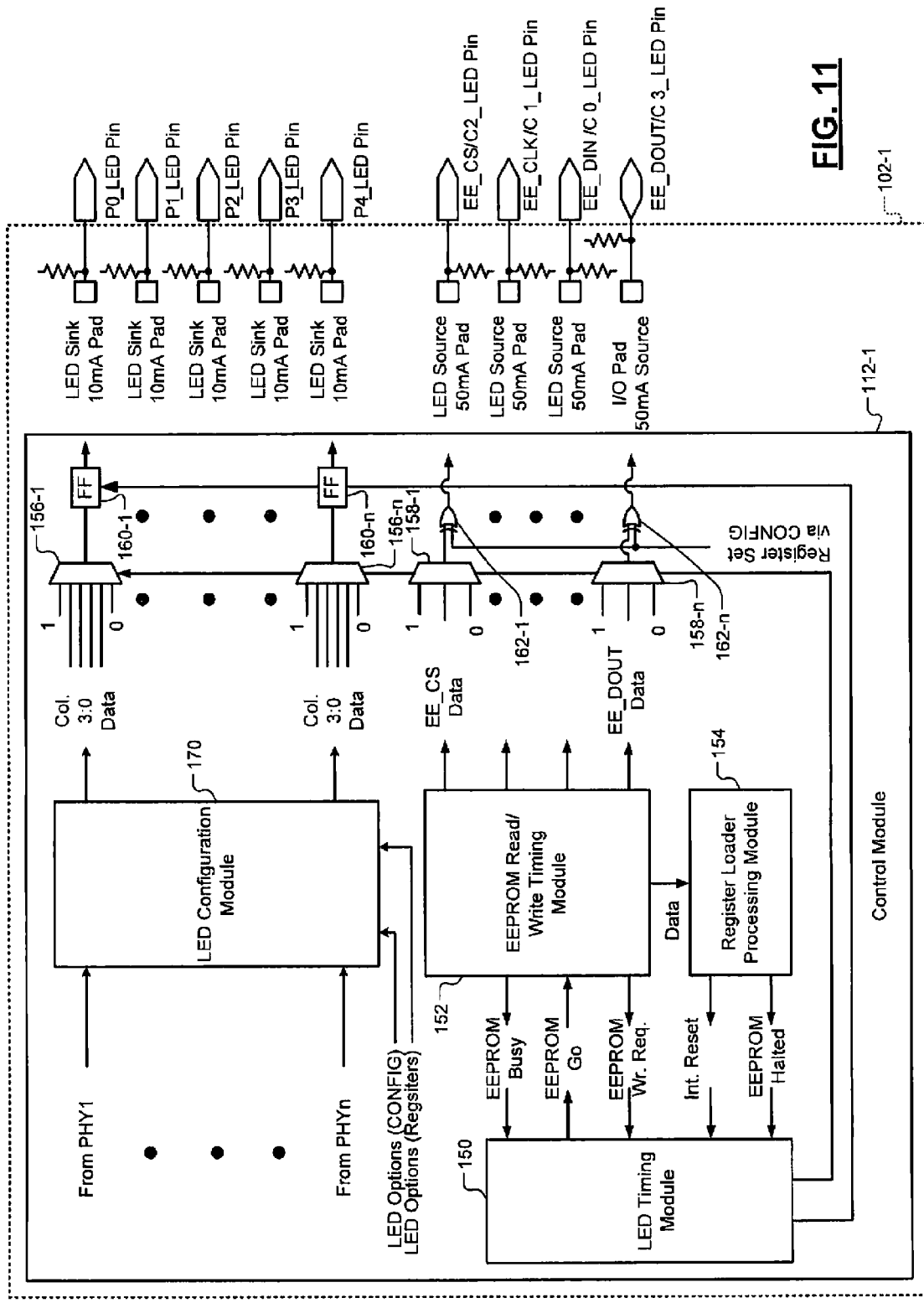
FIG. 11 is a functional block diagram of a control module of the N-port switch of FIG. 1 comprising an LED configuration module.

Referring now to FIGS. 11-17, a switch 102-1 may comprise an LED configuration module 170 that configures the LEDs 106. The switch 102-1 performs at least all the functions of the switch 102. In FIG. 11, the LED configuration module 170 may receive a plurality of LED outputs from each of the PHY devices 104. The LED outputs may include duplex/collision, activity, link/activity, 10M link, 100M link, and 1Gig link signals. The LED configuration module 170 may configure the LEDs 106 of each PHY device 104 based on display modes supplied via CONFIG pins (hereinafter CONFIG display modes) and display modes provided via registers (hereinafter register display modes). The CONFIG display modes may be set initially at RESET while the register display modes may be used to subsequently change the CONFIG display modes.

Figure 12:
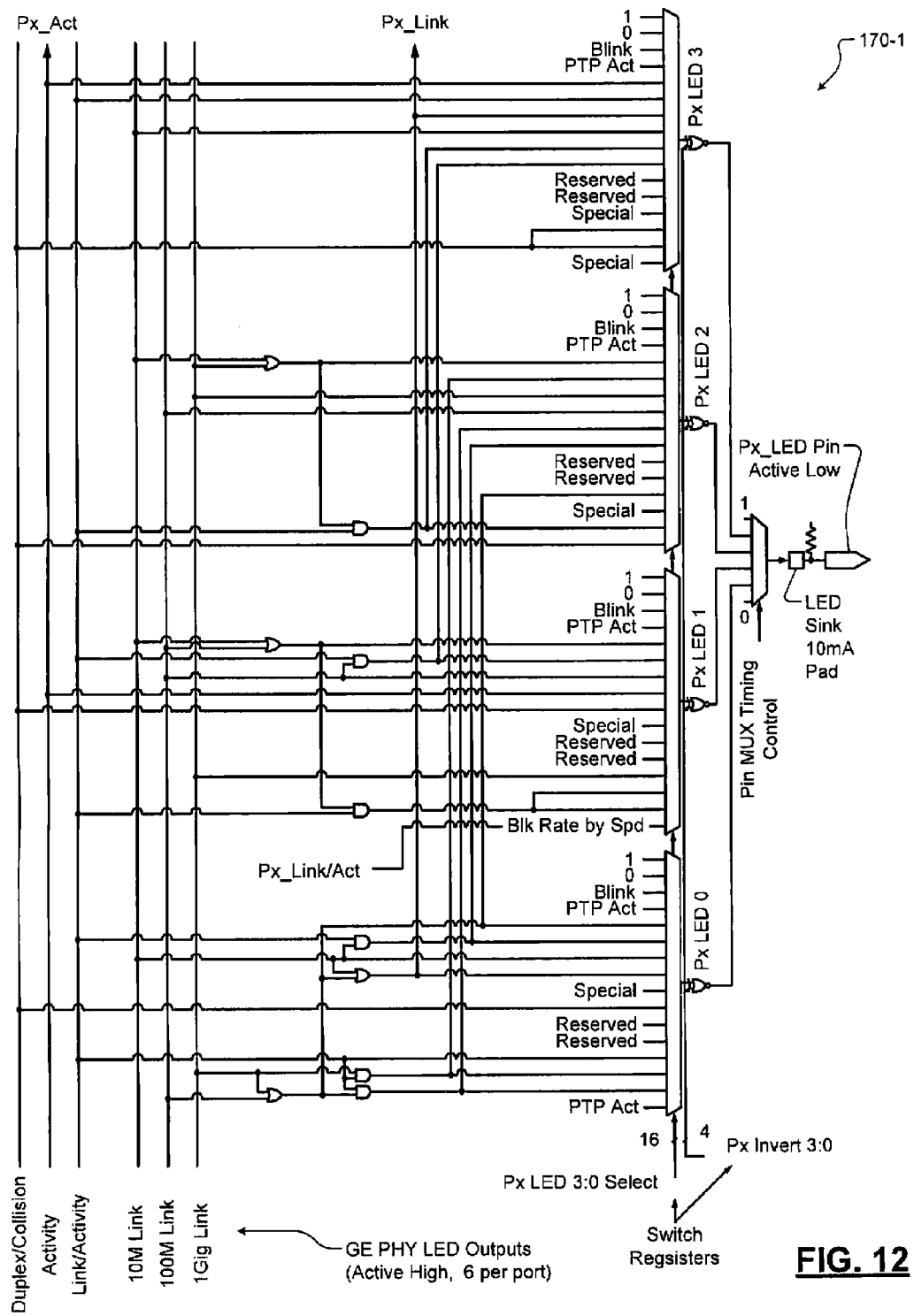
FIG. 12 is a schematic of a portion of the LED configuration module of FIG. 11.
Figure 16:
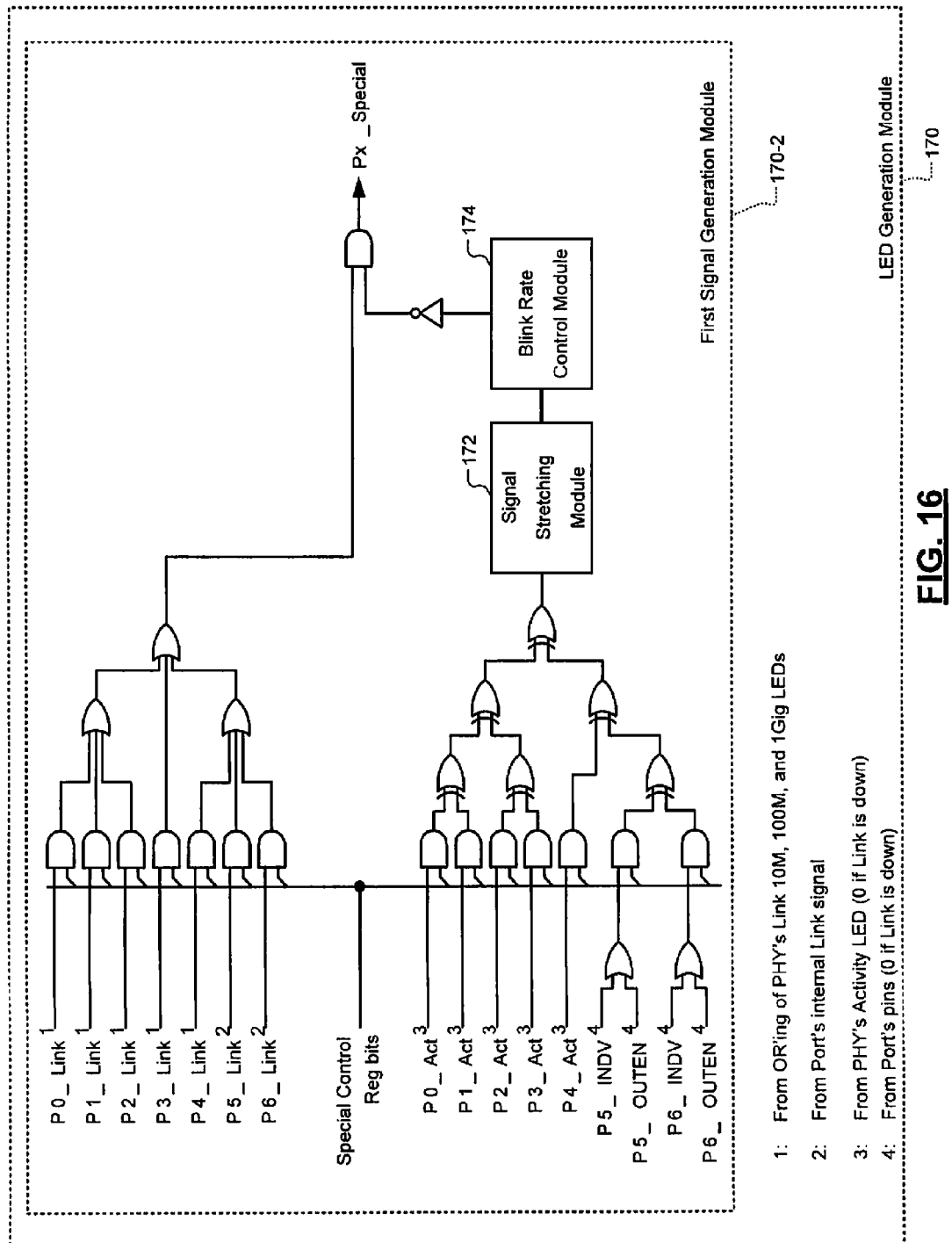
FIGS. 16 and 17 are functional block diagrams of portions of the LED configuration module of FIG. 11 that generate signals utilized by the LED configuration module.
Figure 17:
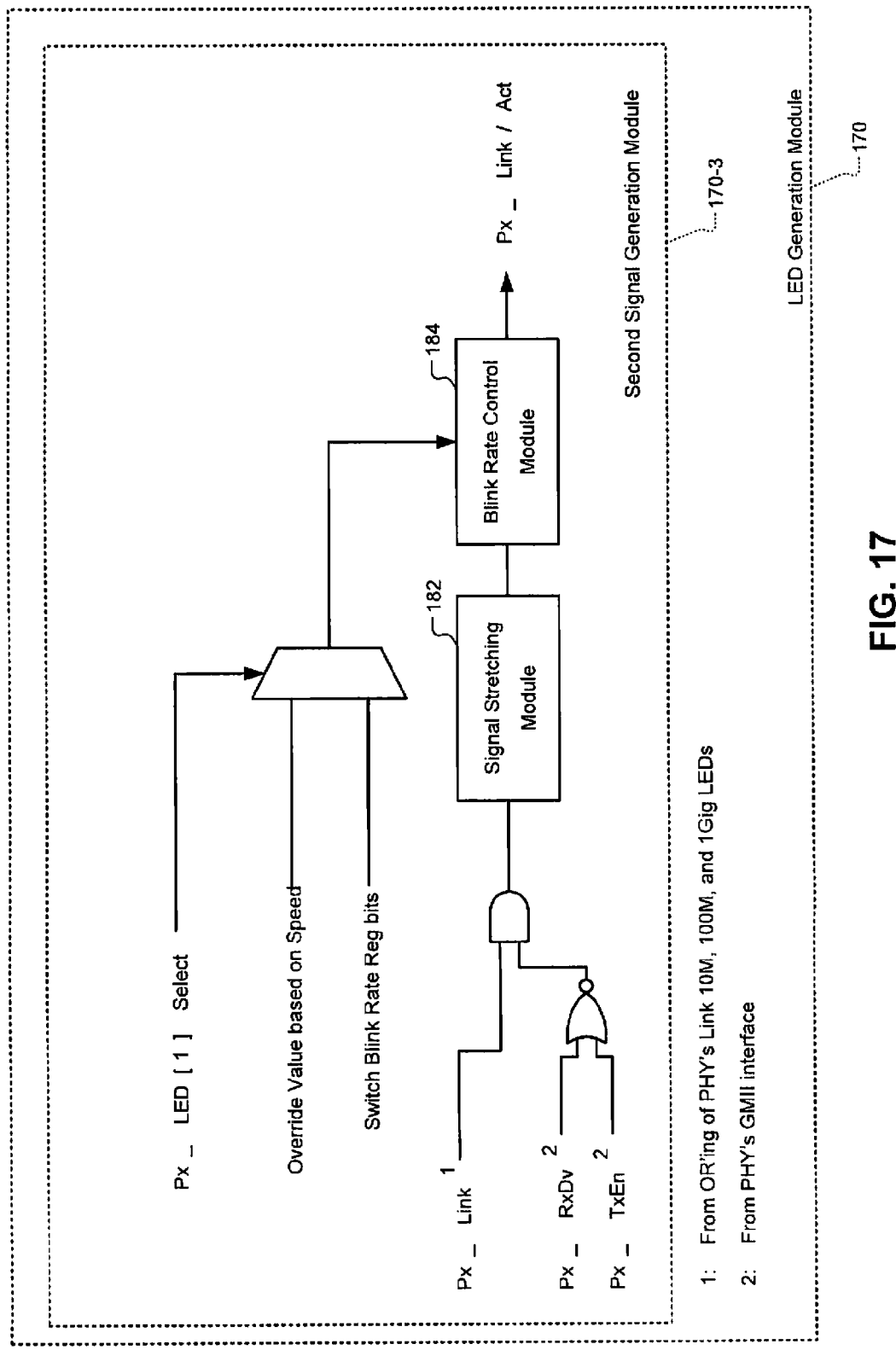

In FIG. 12, the LED configuration module 170 may comprise n units of LED generation module 170-1 (one for each PHY device 104) when the switch 102-1 comprises n PHY devices 104. In FIG. 16, the LED configuration module 170 may comprise n units of a first signal generation module 170-2 (one for each PHY device 104) to generate an input labeled "Special" shown in the FIG. 12. In FIG. 17, the LED configuration module 170 may comprise n units of a second signal generation module 170-3 (one for each PHY device 104) to generate an input labeled "Px Link/Act" shown in FIG. 12. A description of the CONFIG display modes and the register display modes follows.

In the CONFIG display modes, the CONFIG pins may support various power-on-reset (POR) display modes. The POR display modes may be managed without a CPU. For example only, the POR display modes may include the following. In a first display mode, the PHY devices 109 may have a common link/activity LED with each PHY device 104 having separate speed LEDs. The first display mode may be the default display mode. In a second display mode, each PHY device 104 may have a separate link/activity LEDs by speed. In a third display mode, each PHY device 104 may have a link/activity LED with speed indicated by three colors of the LED. In a fourth display mode, each PHY device 104 may have a link/activity LED with speed indicated by a blinking rate of the LED. Many more display modes may be available when a CPU is present and may be selectable via registers.

In the first display mode, the LEDs may be configured as follows. Px_LED[0]=Link/Activity (off=no link, on=link, blink off=activity). Px_LED[1]=1Gig Link (off=no link, on=1Gig link). Px_LED[2]=100M/1Gig Link (off=no link, on=100M or 1Gig link). Px_LED[3]=Special (different per port).

In the second display mode, the LEDs may be configured as follows. Px_LED[0]=1Gig Link/Activity (off=no link, on=Gig link, blink off=activity). Px_LED[1]=10M/100M Link/Activity (off=no link, on=10M or 100M link, blink off=activity). Px_LED[2]=Special (different per port). Px_LED[3]=Duplex/Collision (on=full duplex, off=half duplex, blink=half duplex collision). The second display mode may also support the following configuration: Link/Activity/Speed indicated by 2 colors (both off=no link, LED [0] on and LED[1] off=1Gig link, LED[1] on and LED[0] off=10M or 100M link, blink off=activity).

In the third display mode, the LEDs may be configured as follows. Px_LED[0]=100M/1Gig Link/Activity (off=no link, on=100M or 1Gig link, blink=activity). Px_LED[1]=10M/100M Link/Activity (off=no link, on=10M or 100M link, blink=activity). Px_LED[2]=10M/1Gig Link/Activity (off=no link, on=10M or 1Gig link, blink=activity). Px_LED[3]=Duplex/Collision (on=full duplex, off=half duplex, blink=half duplex collision).

In some implementations, Px_LED[2:0] can be used in three different color combinations as follows: Combination 1: 3-wire 2-Color LED connected to Px_LED[1:0], where 10M=Color a, 100M=Both Color a and b, 1Gig=Color b. Combination 2: 3-wire 2-Color LED connected to Px_LED [2:1], where 10M=Both Color a and b, 100M=Color a, 1Gig=Color b. Combination 3: 3-wire 2-Color LED connected to Px_LED[2] & Px_LED[0], where 10M=Color a, 100M=Color b, 1Gig=Both Color a and b.

In the fourth display mode, the LEDs may be configured as follows. Px_LED[0]=peer-to-peer (PTP) Act (blink on=PTP Activity). Px_LED[1]=Link/Activity/Speed by blink rate (off=no link, on=link, blink at rate-x=activity w/1GIG link, blink at rate-y=activity w/100M link, blink at rate-z=activity w/10M link). For example only, rate-x=84 mSec, rate-y=170 mSec, and rate-z=340 mSec. Px_LED[2]=Duplex/Collision (on=full duplex, off=half duplex, blink=half duplex collision). The blink rate of a collision may be affected by the blink rate change for the speed indication. Px_LED[3]=Special (see text—different per port).

In the register display modes, after CONFIG, the CPU or the EEPROM 108 can change display modes as follows. The initial CONFIG display mode can be overridden. A combined multiple port LAN LED (link/activity/speed) can be configured. Peer-to-peer activity (PTP activity), peer-to-peer receive (PTP Rx) and/or peer-to-peer transmit (PTP Tx) LEDs can be configured. The LEDs can be forced on or off or blinking. While CONFIG pins may be used to selectively turn off LEDs 106, registers may be used to change the brightness of the LEDs 106.

In FIGS. 13-15, for example only, Tables 1-3 different LED functions are shown. In FIG. 13, Table 1 lists the supported/desired LED functions and which LED can display each function. Each number below an LED indicates a register selection setting to display a function shown in the row of the LED. In FIG. 14, Table 2 shows an LED selection mapping that is controllable by register. The functions appear more than once and generally on different LEDs. Thus, many different combinations of LED functions may be possible and may be user-selected.

In FIG. 15, Table 3 shows LED display modes for a GE PHY device when the switch 102-1 includes GE PHY devices. The GE PHY device may default its six LED lines (PHY LED[0] through PHY LED[5]) to one of the display modes shown. The GE PHY device may set the six LED lines to the fourth display mode as shown in FIG. 12.

Occasionally, a single frame of data may cause an Activity LED to blink two to three times. Accordingly, a pulse stretch duration of the signal driving the Activity LED may have to be changed. Additionally, a default blink rate (e.g., 84 mSec) may not suffice when the blink rate is to be changed based on link speed.

Accordingly, timing of the LEDs 106 may be controlled by applying stretching and blink rate adjustments to signals driving the LEDs 106. The stretching and blink rate adjustments may be achieved in many ways.

For example, a PHY core may be modified to change a pulse stretch duration at reset and to allow a register value that controls the blink rate to be changed via external wires. Alternatively, the PHY core may be modified to change the pulse stretch duration at reset, and the blink rate may be modified externally. Doing so, however, may not allow stretching by powers of 2.

Instead, an EEPROM may be used to change the PHY settings. This, however, defeats the purpose of trying to eliminate or minimize use of an EEPROM in unmanaged (i.e., CPU-less) configurations. Accordingly, logic for stretching and blinking may be used instead for the stretching and blink rate adjustments.

Further, routers may typically include LEDs on back and front panels. The back panel may include LEDs next to each port to indicate speed of the port, whether a cable is correctly attached to the port, etc. The front panel may include a single combined Link/Activity LED per port to indicate packet flow. Alternatively, the front panel may include LEDs that summarize status of the ports.

Signals that drive the LEDs on the front panel are typically generated from signals that drive the LEDs on the back panel. For example, the signals that drive the LEDs on the back panel are combined (e.g., OR'ed, AND'ed, etc.) to generate the signals that drive the LEDs on the front panel. Accordingly, the LEDs on the front panel cannot indicate status of each port.

Instead, a special LED signal per port may be generated based on signals output by the PHY devices 104. Further, when the LEDs 106 are not multiplexed, a combined Link/Activity signal per port may be generated. Both solutions are discussed below in turn.

In FIG. 16, the first signal generation module 170-2 generates a special LED signal per port based on signals output by the PHY devices 104. A register may be used to determine which signals of which port may be combined to generate the special LED signal per port.

The first signal generation module 170-2 comprises a signal stretching module 172 and a blink rate control module 174. An input signal to the signal stretching module 172 generated by a combinational logic (i.e., gates shown) toggles when activity occurs at a port. The signal stretching module 172 stretches a rising edge of the input signal and generates a stretched signal (i.e., a signal having a stretched rising edge relative to the input signal).

The blink rate control module 174 generates a blinking signal based on the stretched signal when the stretched rising edge stays active beyond a blinking time. The blinking signal is used to drive the special LED, which blinks according to the blinking signal.

The Special Control Register bits activate the ports into this combined LED function. Each Control Register bit is input to a Link gate and an Activity gate of each port as shown. Although XOR gates are shown, OR gates may be used instead when Activity signals from each of the ports include pulses at a start of a frame instead of levels for the duration of the frame.

In FIG. 17, the second signal generation module 170-3 may generate a combined Link/Activity signal per port when the LEDs 106 are not multiplexed. The second signal generation module 170-3 comprises a signal stretching module 182 and a blink rate control module 184 that perform the functions of the signal stretching module 172 and the blink rate control module 174, respectively.

The blinking rate of an LED may be changed proportionally to speed of a port. For example, three different blinking rates may be used for speeds of 10M, 100M, and 1Gig, respectively. Thus, a single inexpensive monochrome LED may be used to indicate three different speeds instead of using three LEDs or a three-color LED that may be typically used.

In some implementations, the switch 102 may not include a central processing unit (CPU). Accordingly, the EEPROM 108 may be used to configure the switch 102. For example, the EEPROM 108 may assign a unique media access control (MAC) address to the switch 102. In a remotely managed network, configuration settings of the switch 102 may be changed from a remote network device.

Occasionally, however, the power supply to the switch 102 may fail. When the power to the switch 102 is restored, the switch 102 may revert to default settings instead of modified settings. The modified settings may be restored on power up by writing to the EEPROM 108 at power up.

According to the present disclosure, new registers may be used for writing to the EEPROM 108 when writes to the EEPROM 108 are enabled via a CONFIG pin. EEPROM writes are allowed, however, when the register loader processing module 154 is halted. Accordingly, when the register loader processing module 154 is not halted, a new register bit may be used to stop the register loader processing module 154 until a reload is performed.

Some EEPROM types (e.g., the 4-wire EEPROM) are typically un-write protected via a command. These EEPROMs may be un-protected before a write operation. The EEPROMs may then be write-protected again after a last write operation. Thus, each write operation may include three steps: 1) write enable, 2) write data, and 3) write protect).

A new set of registers may be used to hold a target address, read/write data, read/write commands, and a busy status during reads and writes to the EEPROM 108. For example, two registers may be used as follows. A first register may be used for 16-bits of data to write and/or read back from the EEPROM 108. A second register may be used for 8-bit EEPROM address, an Opcode, and the busy status.

Figure 18:
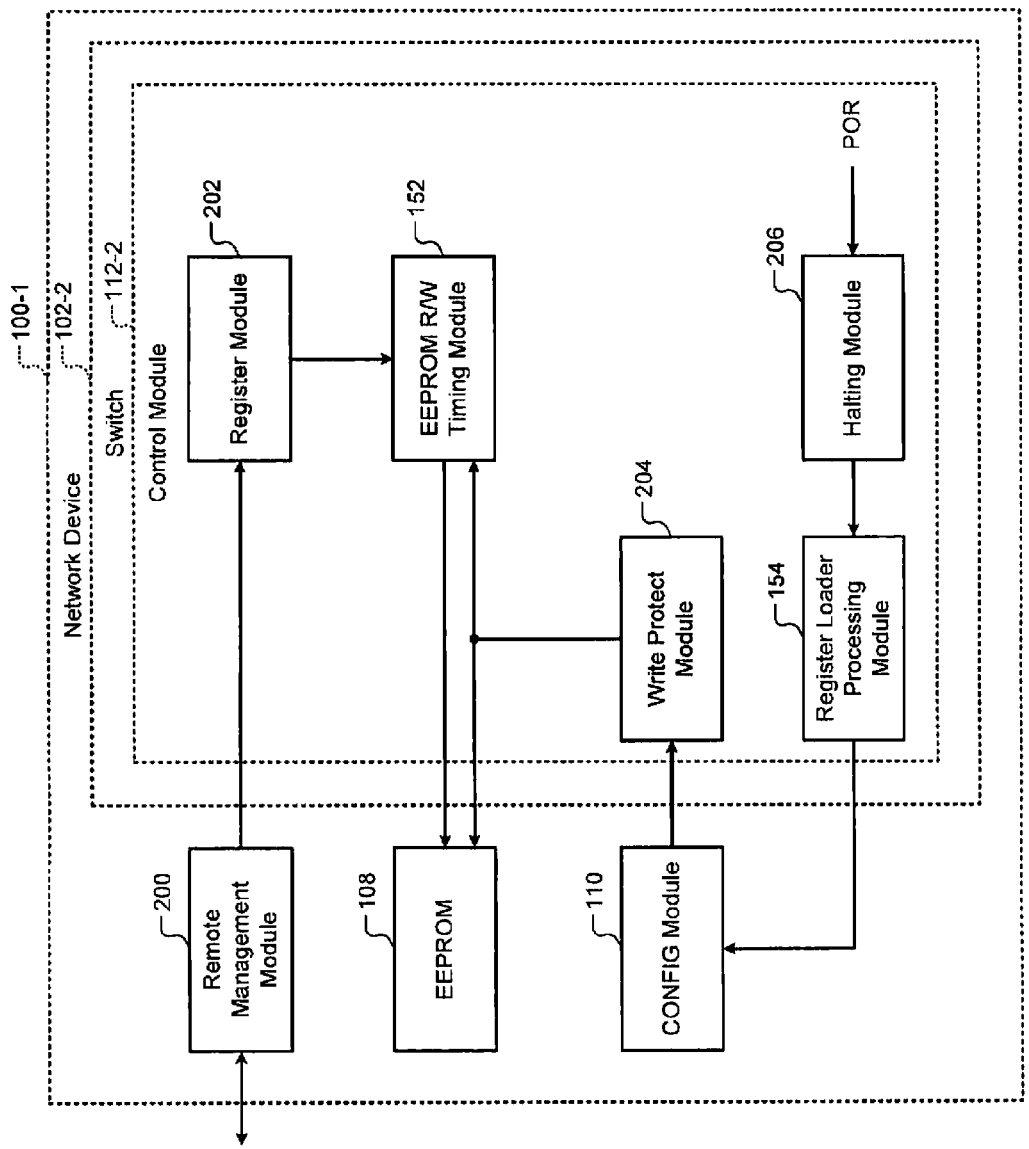
FIG. 18 is a functional block diagram of a network device comprising a control module that reloads configuration of the network device in an EEPROM.

Referring now to FIG. 18, a network device 100-1 comprises the EEPROM 108, the CONFIG module 110, a switch 102-2, and a remote management module 200. The switch 102-2 may perform at least all the functions of the switch 102 and/or switch 102-1. The remote management module 200 interfaces the network device 100-1 to a remote network device (not shown). The remote network device communicates with the remote management module 200 via a network (not shown) and remotely configures the network device 100-1.

The switch 102-2 comprises a control module 112-2. The control module 112-2 may perform at least all the functions of the control module 112 and/or control module 112-1. The control module 112-2 comprises the EEPROM timing module 152, the register loader processing module 154, a register module 202, a write protect module 204, and a halting module 206.

The register module 202 stores the configuration for the network device 100-1 received from the remote management module 200. Additionally, the register module 202 stores read/write commands to be output to the EEPROM timing module 152 when the configuration is to be reloaded (rewritten) to the EEPROM 108 after power supply to the network device 100-1 is restored.

The halting module 206 halts the register loader processing module 154 when power supply to the network device 100-1 is restored. The register loader processing module 154 outputs a Halted signal to CONFIG module 110.

The CONFIG module 110 outputs a control signal to the write protect module 204 when writes to the EEPROM 108 are to be performed after power supply to the network device 100-1 is restored. The write protect module 204 enables writes to the EEPROM 108 based on the control signal received from the CONFIG module 110. The write protect module 204 outputs a write enable signal to the EEPROM timing module 152.

The EEPROM timing module 152 retrieves the read/write commands and the configuration from the register module 202. The EEPROM timing module 152 executes the read/write commands and loads the configuration into the EEPROM 108. The read/write commands include a command that generates the EEPROM Busy signal while the configuration is reloaded into the EEPROM 108.

After the configuration is loaded, the write protect module 204 write protects the EEPROM 108, and the EEPROM Busy signal is de-asserted. Subsequently, the EEPROM 108, the EEPROM timing module 152, and the register loader processing module 154 resume normal operation described with reference to the control module 112.

Figure 19:
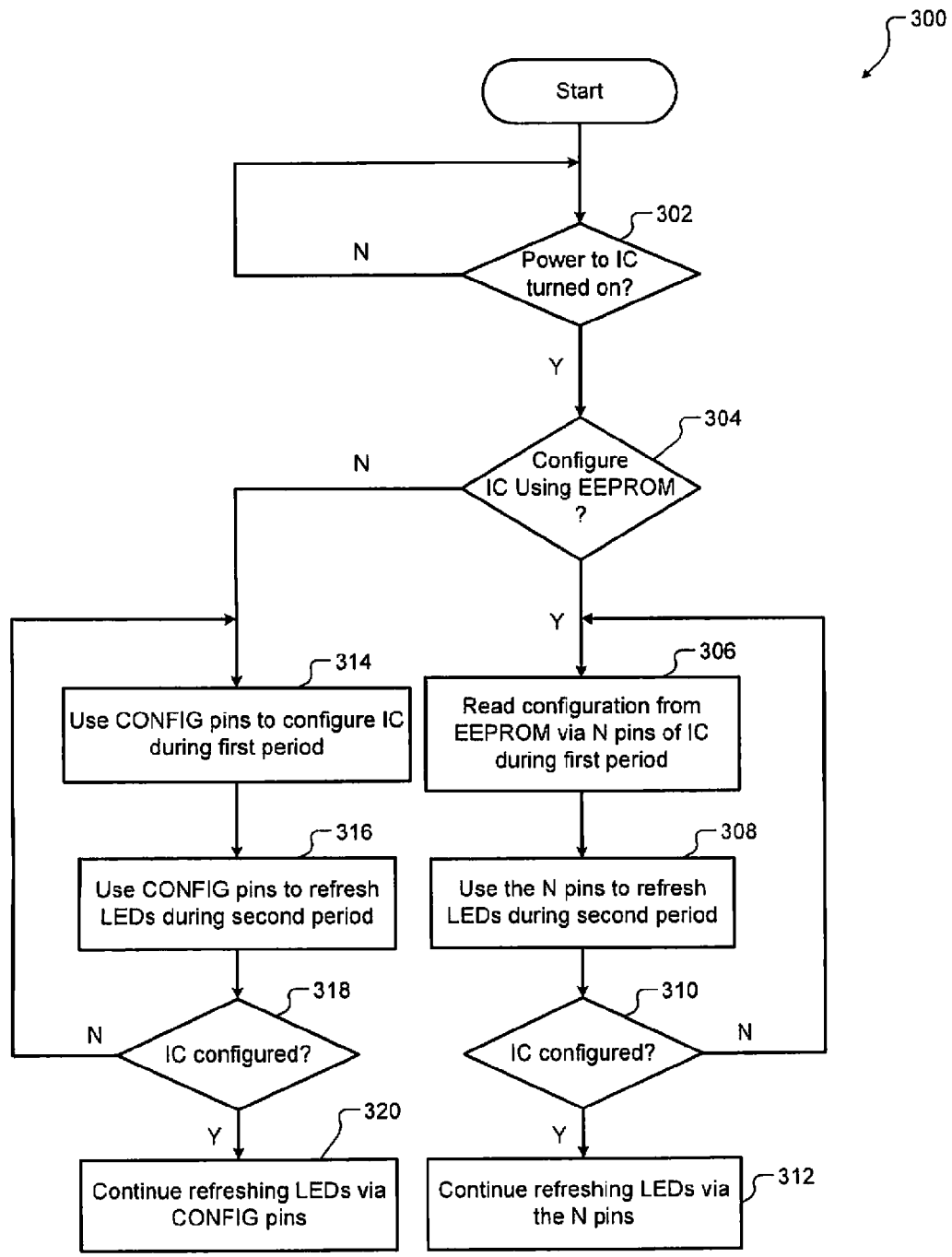
FIG. 19 is a flowchart of a method for refreshing the LEDs via multiplexed pins of the IC.

Referring now to FIG. 19, steps of a method 300 for refreshing LEDs via multiplexed pins of the IC are shown. At 302, control determines if power to the IC is turned on. Control waits if power to the IC is not turned on. At 304, control determines whether the IC is to be configured using EEPROM when power to the IC is turned on.

At 306, control reads configuration data from EEPROM via N pins of the IC during a first period when the IC is to be configured using EEPROM. At 308, control uses the N pins to refresh LEDs during a second period. At 310, control determines whether the IC is configured. Control returns to 306 if the IC is not configured. At 312, control continues to refresh LEDs via the N pins if the IC is configured.

At 314, control uses CONFIG pins of the IC to configure the IC during a first period when EEPROM is not used to configure the IC. At 316, control uses the CONFIG pins to refresh LEDs during a second period. At 318, control determines whether the IC is configured. Control returns to 314 if the IC is not configured. At 320, control continues to refresh LEDs via the CONFIG pins if the IC is configured.

Figure 20:
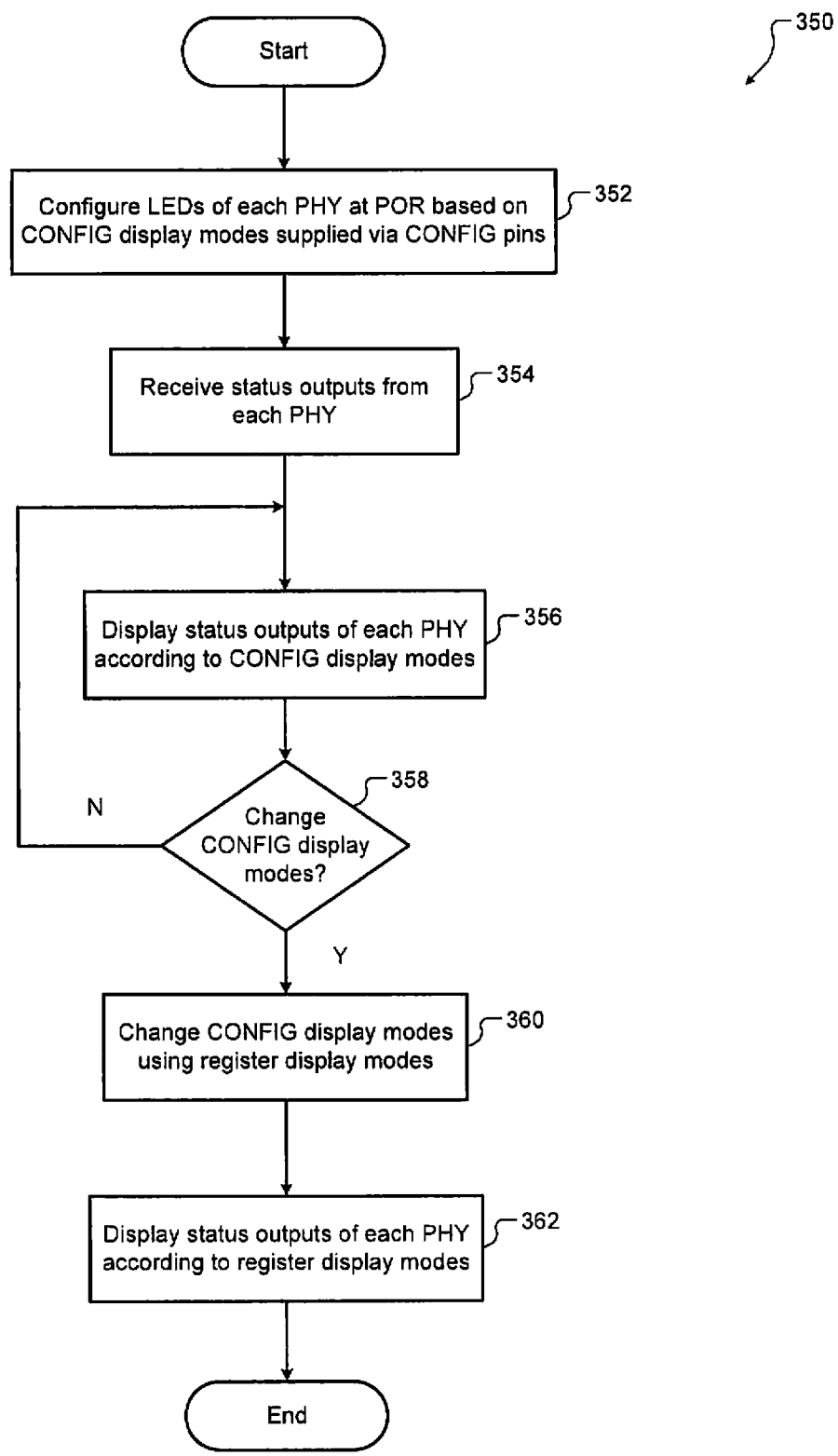
FIG. 20 is a flowchart of a method for setting display modes to display statuses on the LEDs.

Referring now to FIG. 20, steps of a method 350 for setting display modes to display statuses on LEDs are shown. At 352, control configures LEDs at power-on-reset based on CONFIG display modes supplied via CONFIG pins of the IC. At 354, control receives status outputs from each PHY. At 356, control displays the status outputs of each PHY according to the CONFIG display modes.

At 358, control determines whether to change the CONFIG display modes. Control returns to 356 if the CONFIG display modes are unchanged. At 360, control changes the CONFIG display modes using register display modes. At 362, control displays the status outputs of each PHY according to the register display modes.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An integrated circuit (IC) within an IC package, the IC comprising:
a memory control module configured to control read/write operations of a memory IC via N pins of the IC package, where N is an integer greater than 1, and wherein the memory IC is external to the IC package; and
a timing module configured to control on/off timing of (N*M) light emitting diodes (LEDs) arranged in N columns and M rows connected to the N pins and M pins of the IC, respectively, where M is an integer greater than 1,
wherein the read/write operations utilize the N pins during a first period, and wherein the N*M LEDs receive data from the M pins and refresh signals from the N pins during a second period that is different than the first period.

2. The IC of claim 1, wherein in response to power being applied to the IC:
the memory control module configures the IC by reading information from the memory IC via the N pins during the first period; and
the timing module allows testing of the N*M LEDs via the N pins during the second period.

3. The IC of claim 1, wherein the timing module generates control signals to output N bits of the data from one of the M pins to display the N bits on N of the N*M LEDs in a corresponding one of the M rows during the second period, respectively.

4. The IC of claim 1, wherein the N pins are directly connected to the N columns and the memory IC, respectively.

5. The IC of claim 1, wherein current through the N*M LEDs is proportional to a number of the N*M LEDs lit to display the data.

6. The IC of claim 1, wherein the memory IC includes electrically erasable programmable read-only memory (EEPROM) that stores information for configuring the IC.

7. The IC of claim 1, wherein the memory control module and the timing module exchange a handshake signal that determines the first period and the second period.

8. The IC of claim 3 further comprising M physical layer (PHY) devices that output the data to the N*M LEDs via the M pins, respectively, wherein the memory control module configures the M PHY devices by reading information from the memory IC when power is applied to the IC.

9. The IC of claim 8 further comprising an LED control module configured to:
receive status signals from one of the M PHY devices; and
generate N bits of status data for the one of the M PHY devices based on the status signals,
wherein during the second period:
the control signals output the N bits via a corresponding one of the M pins; and
N of the N*M LEDs in one of the M rows connected to the corresponding one of the M pins display the N bits, respectively.

10. The IC of claim 9, wherein:
the N bits include a link/activity status and a speed status of the one of the M PHY devices;
one of the N of the N*M LEDs displays the link/activity status and the speed status; and
a blink rate of the one of the N of the N*M LEDs is proportional to a speed of the one of the M PHY devices.

11. The IC of claim 8, further comprising a register module configured to receive the information from a remote network device via a network, wherein the memory control module writes the information to the memory IC via the N pins during the first period when power is applied to the IC.

12. The IC of claim 11, wherein the timing module allows testing of the N*M LEDs via the N pins during the second period when power is applied to the IC.

13. The IC of claim 1, wherein:
the memory control module generates a busy signal to indicate when the N pins are used for the read/write operations during the first period, and
the timing module generates control signals to latch the data for subsequently outputting the data to the N*M LEDs via the M pins during the second period.

14. A network device comprising:
the IC of claim 1;
the memory IC; and
the N*M LEDs.

15. A method for operating an integrated circuit (IC) within an IC package, the method comprising:
controlling read/write operations of a memory IC via N pins of the IC package, where N is an integer greater than 1, and wherein the memory IC is external to the IC package;
controlling on/off timing of (N*M) light emitting diodes (LEDs) arranged in N columns and M rows connected to the N pins and M pins of the IC, respectively, where M is an integer greater than 1;
utilizing the N pins for the read/write operations during a first period; and
receiving data from the M pins and refresh signals from the N pins for the N*M LEDs during a second period that is different than the first period.

16. The method of claim 15 further comprising:
configuring the IC by reading information from the memory IC via the N pins during the first period in response to power being applied to the IC; and
testing the N*M LEDs via the N pins during the second period in response to power being applied to the IC.

17. The method of claim 15 further comprising:
generating a busy signal to indicate when the N pins are used for the read/write operations during the first period; and
generating control signals to latch the data for subsequently outputting the data to the N*M LEDs via the M pins during the second period.

18. The method of claim 17 further comprising:
outputting the data from M physical layer (PHY) devices to the N*M LEDs via the M pins, respectively; and
configuring the M PHY devices by reading information from the memory IC when power is applied to the IC.

19. The method of claim 18 further comprising:
receiving status signals from one of the M PHY devices;
generating N bits of status data for the one of the M PHY devices based on the status signals;
outputting the N bits via a corresponding one of the M pins during the second period using the control signals; and
displaying the N bits during the second period using N of the N*M LEDs in one of the M rows connected to the corresponding one of the M pins, respectively.

20. The method of claim 19 further comprising:
including a link/activity status and a speed status of the one of the M PHY devices in the N bits;
displaying the link/activity status and the speed status using one of the N of the N*M LEDs; and
blinking the one of the N of the N*M LEDs at a blink rate that is proportional to a speed of the one of the M PHY devices.

* * * * *